United States Patent
Kiyosawa et al.

(10) Patent No.: US 11,171,214 B2
(45) Date of Patent: Nov. 9, 2021

(54) SEMICONDUCTOR EPITAXIAL WAFER, SEMICONDUCTOR DEVICE, AND METHOD FOR MANUFACTURING SEMICONDUCTOR EPITAXIAL WAFER

(71) Applicant: Panasonic Intellectual Property Management Co., Ltd., Osaka (JP)

(72) Inventors: Tsutomu Kiyosawa, Toyama (JP); Atsushi Ohoka, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/776,477

(22) Filed: Jan. 29, 2020

(65) Prior Publication Data

US 2020/0303506 A1   Sep. 24, 2020

(30) Foreign Application Priority Data

Mar. 22, 2019 (JP) .............................. JP2019-054563

(51) Int. Cl.
| | |
|---|---|
| *H01L 21/00* | (2006.01) |
| *H01L 29/36* | (2006.01) |
| *H01L 21/02* | (2006.01) |
| *H01L 29/78* | (2006.01) |
| *H01L 29/16* | (2006.01) |
| *H01L 27/088* | (2006.01) |

(52) U.S. Cl.
CPC .......... *H01L 29/36* (2013.01); *H01L 21/0257* (2013.01); *H01L 21/02378* (2013.01); *H01L 21/02529* (2013.01); *H01L 27/088* (2013.01); *H01L 29/1608* (2013.01); *H01L 29/78* (2013.01)

(58) Field of Classification Search
CPC .............. H01L 29/36; H01L 21/02378; H01L 21/02529; H01L 21/0257
See application file for complete search history.

(56) References Cited

U.S. PATENT DOCUMENTS

| | | | |
|---|---|---|---|
| 10,361,297 B2 * | 7/2019 | Kiyosawa | ........... H01L 29/1045 |
| 2015/0001553 A1 * | 1/2015 | Kudou | ................ H01L 29/1608 |
| | | | 257/77 |
| 2017/0288025 A1 | 10/2017 | Hori et al. | |
| 2018/0254339 A1 * | 9/2018 | Kiyosawa | ........... H01L 29/1045 |

FOREIGN PATENT DOCUMENTS

JP   2017-052674   3/2017

* cited by examiner

*Primary Examiner* — Richard A Booth

(74) *Attorney, Agent, or Firm* — McDermott Will and Emery LLP

(57) ABSTRACT

Variations in device characteristics in a plane parallel to the principal surface of a semiconductor wafer are suppressed. A semiconductor epitaxial wafer includes a semiconductor wafer and a first conductivity type semiconductor epitaxial layer that is disposed on a principal surface of the semiconductor wafer and contains a first conductivity type impurity, and the thickness distribution of the semiconductor epitaxial layer and the concentration distribution of the impurity in the semiconductor epitaxial layer have a positive correlation in a plane parallel to the principal surface of the semiconductor wafer.

13 Claims, 14 Drawing Sheets

Upstream Side End Portion e1←Distance x→Downstream Side End Portion e2

Upstream Side End Portion e1←Distance x→Downstream Side End Portion e2

SEMICONDUCTOR EPITAXIAL WAFER, SEMICONDUCTOR DEVICE, AND METHOD FOR MANUFACTURING SEMICONDUCTOR EPITAXIAL WAFER

BACKGROUND

1. Technical Field

The present disclosure relates to a semiconductor epitaxial wafer, a semiconductor device, and a method for manufacturing a semiconductor epitaxial wafer.

2. Description of the Related Art

Silicon carbide (SiC) is a semiconductor material larger in bandgap and higher in hardness than silicon (Si). SiC is applied to, for example, a power device such as switching devices and rectifier devices. A power device using SiC has an advantage that, for example, power loss can be diminished as compared with a power device using Si.

Typical examples of a semiconductor device using SiC include a metal-insulator-semiconductor field-effect transistor (MISFET) and a Schottky-barrier diode (SBD). Examples of the MISFET include a metal-oxide-semiconductor field-effect transistor (MOSFET).

A semiconductor device using SiC (hereinafter, "silicon carbide semiconductor device") is formed using a silicon carbide epitaxial layer formed on the principal surface of a silicon carbide wafer. A plurality of silicon carbide semiconductor devices (chips) are usually fabricated from a single silicon carbide wafer. In each of the silicon carbide semiconductor devices, the silicon carbide epitaxial layer includes a drift layer.

In the present specification, the "silicon carbide wafer" refers to a substrate obtained by cutting and polishing single crystal SiC fabricated by a modified Lely method, a sublimation method, or the like into a predetermined size. In addition, a substrate in which a silicon carbide epitaxial layer is formed on a silicon carbide wafer is referred to as a "silicon carbide epitaxial wafer". A silicon carbide epitaxial wafer is disclosed in PTL 1, for example.

In the present specification, the "silicon carbide epitaxial wafer" also includes a substrate in which a plurality of silicon carbide semiconductor devices (for example, SiC-MISFET) or only a part of the device structures is formed on a silicon carbide wafer on which a silicon carbide epitaxial layer is formed. Incidentally, the silicon carbide epitaxial wafer on which a plurality of silicon carbide semiconductor devices are formed is then cut (diced) into a predetermined chip size, and a plurality of silicon carbide semiconductor devices are thus separated from each other. Moreover, in the present specification, semiconductor wafers of SiC, gallium nitride (GaN) and the like are collectively referred to as "semiconductor wafers" and substrates on which semiconductor layers of SiC, GaN and the like are formed on semiconductor wafers are collectively referred to as "semiconductor epitaxial wafers". The semiconductor epitaxial wafers also include substrates on which a plurality of semiconductor devices or only a part of the device structures is formed.

CITATION LIST

Patent Literature

PTL 1: Unexamined Japanese Patent Publication No. 2017-052674

SUMMARY

It is required to diminish variations in characteristics such as avalanche breakdown voltage and on-resistance Ron between semiconductor devices (between chips) or in the semiconductor device (in the chip) formed on a semiconductor epitaxial wafer. In the present specification, variations in device characteristics that occur between semiconductor devices or in semiconductor devices, namely, in a plane of semiconductor wafer, are referred to as "in-plane variations".

An exemplary embodiment of the present disclosure provides a semiconductor epitaxial wafer or semiconductor device capable of diminishing variations in characteristics in a plane parallel to a principal surface of a semiconductor wafer.

A semiconductor epitaxial wafer according to an exemplary embodiment of the present disclosure includes a semiconductor wafer and a first conductivity type semiconductor epitaxial layer that is disposed on a principal surface of the semiconductor wafer and contains a first conductivity type impurity. Moreover, the thickness distribution of the semiconductor epitaxial layer and the concentration distribution of the impurity in the semiconductor epitaxial layer have a positive correlation in a plane parallel to the principal surface of the semiconductor wafer.

A semiconductor device according to an exemplary embodiment of the present disclosure includes a semiconductor substrate, a semiconductor epitaxial layer, a body region, a source region, and a gate electrode. The semiconductor epitaxial layer is disposed on the principal surface of the semiconductor substrate and has a first conductivity type containing a first conductivity type impurity. The body region is in contact with the semiconductor epitaxial layer and has a second conductivity type. The source region is in contact with the body region and has a first conductivity type. The gate electrode is disposed on the semiconductor epitaxial layer via a gate insulating film. Moreover, the thickness distribution of the semiconductor epitaxial layer and the concentration distribution of the impurity in the semiconductor epitaxial layer have a positive correlation in a plane parallel to the principal surface of the semiconductor substrate.

A semiconductor device according to another exemplary embodiment of the present disclosure includes a semiconductor substrate, a semiconductor epitaxial layer, a first electrode, and a second electrode. The semiconductor epitaxial layer is disposed on the principal surface of the semiconductor substrate and has a first conductivity type containing a first conductivity type impurity. The first electrode is disposed on the semiconductor epitaxial layer and is in contact with the semiconductor epitaxial layer. The second electrode is disposed on a surface on a side opposite to the principal surface of the semiconductor substrate and is in contact with the semiconductor substrate. Moreover, the thickness distribution of the semiconductor epitaxial layer and the concentration distribution of the impurity in the semiconductor epitaxial layer have a positive correlation in a plane parallel to the principal surface of the semiconductor substrate.

A method for manufacturing a semiconductor epitaxial wafer according to an exemplary embodiment of the present disclosure includes (A) a step of preparing a semiconductor wafer and (B) a step of forming a first conductivity type semiconductor epitaxial layer containing a first conductivity type impurity by epitaxially growing a semiconductor on a principal surface of the semiconductor wafer. A condition for epitaxial growth is controlled in step (B) so that thickness distribution of the semiconductor epitaxial layer and concentration distribution of the impurity in the semiconductor epitaxial layer have a positive correlation in a plane parallel to the principal surface of the semiconductor wafer.

According to an aspect of the present disclosure, a semiconductor epitaxial wafer or semiconductor device capable of diminishing variations in device characteristics in a plane parallel to the principal surface of a semiconductor wafer.

DETAILED DESCRIPTION

The on-resistance and avalanche breakdown voltage of a semiconductor device formed using a semiconductor epitaxial wafer are determined by various parameters relating to the materials and configurations of the semiconductor epitaxial wafer and semiconductor device. Hence, it is considered that the variations (in-plane variation) in on-resistance and avalanche breakdown voltage in the plane of semiconductor wafer can be diminished if these parameters can be made substantially uniform in the plane of semiconductor wafer. However, some of the parameters cause distribution (in-plane distribution) in the plane of semiconductor wafer due to, for example, the manufacturing process of the semiconductor device. It is thus difficult to make such parameters uniform in the plane of semiconductor wafer.

On the other hand, the present inventors have found out that the in-plane variation in on-resistance and avalanche breakdown voltage among the parameters which determine the on-resistance and avalanche breakdown voltage can be diminished by focusing on the impurity concentration (carrier concentration) and thickness of the semiconductor epitaxial layer and controlling the correlation of the in-plane distributions of these parameters.

Hereinafter, the knowledge which has become the basis of the present disclosure on the characteristics of a semiconductor device is described by taking a silicon carbide semiconductor device as an example.

Avalanche Breakdown Voltage $V_{AVA}$

In a silicon carbide semiconductor device formed using a silicon carbide epitaxial wafer, avalanche breakdown voltage (hereinafter abbreviated as "breakdown voltage") $V_{AVA}$ depends on impurity concentration (carrier concentration)

Nd in the silicon carbide epitaxial layer and thickness td of the silicon carbide epitaxial layer. Specifically, a higher breakdown voltage $V_{AVA}$ is attained as impurity concentration Nd in the silicon carbide epitaxial layer is lower and as thickness td of the silicon carbide epitaxial layer is thicker. Impurity concentration Nd is, for example, the concentration of n-type impurities.

Figure 17A:
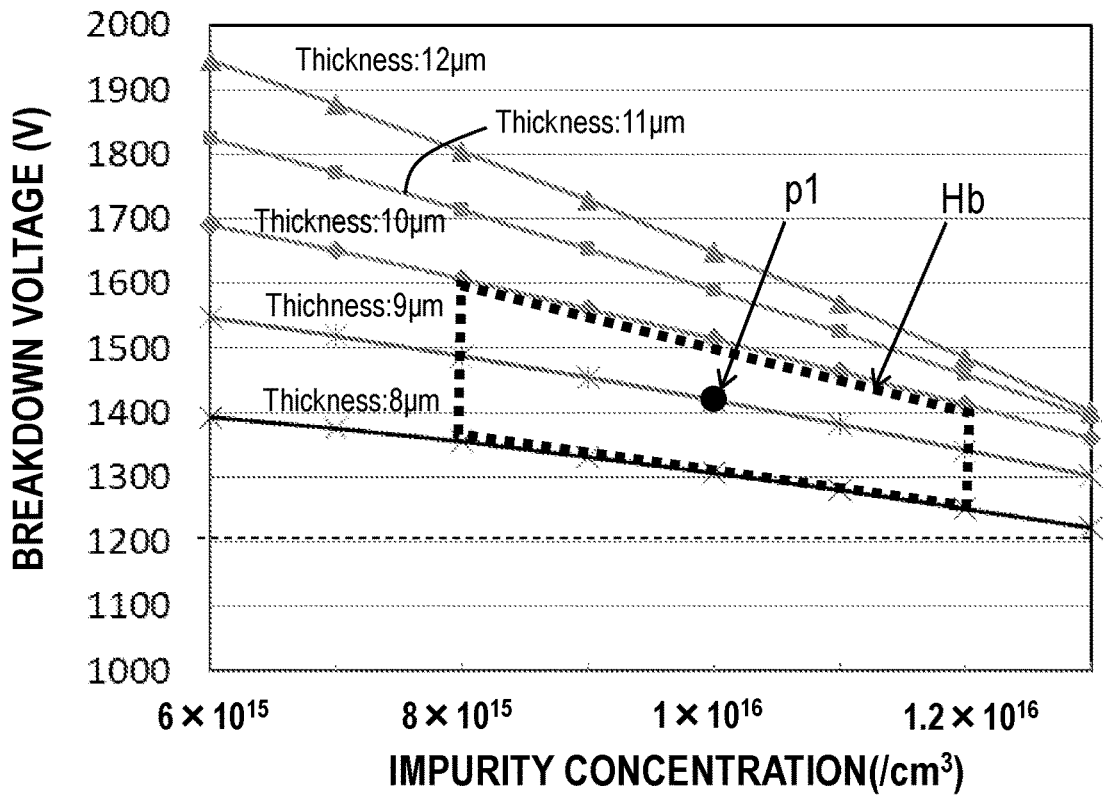
FIG. 17A is a diagram illustrating the relation between the impurity concentration and thickness of a silicon carbide epitaxial layer and the breakdown voltage of a silicon carbide semiconductor device.

FIG. 17A is a diagram illustrating an example of the relation between impurity concentration Nd and thickness td of the silicon carbide epitaxial layer and breakdown voltage $V_{AVA}$ of the silicon carbide semiconductor device. FIG. 17A illustrates the results of breakdown voltage $V_{AVA}$ of the silicon carbide semiconductor device calculated based on the following Equation (1).

[Mathematical Formula 1]

$$V_{AVA} = \frac{t_d}{2}\left(2E_c - \frac{qN_d t_d}{\varepsilon_{SiC}}\right) + \frac{\varepsilon_{SiC}}{2qN_b}\left(E_c - \frac{qN_d t_d}{\varepsilon_{SiC}}\right) \quad (1)$$

Nd: impurity concentration in silicon carbide epitaxial layer
td: thickness of silicon carbide epitaxial layer
$\varepsilon_{SiC}$: dielectric constant of SiC ($=\varepsilon r \times \varepsilon 0 = 9.7 \times 8.85 \times 10^{-14}$)
Nb: impurity concentration in buffer layer
Ec: dielectric breakdown electric field strength
Incidentally, ε0 is the dielectric constant in a vacuum, and εr is the relative dielectric constant of a substance.

Dielectric breakdown electric field strength Ec in Equation (1) varies depending on impurity concentration Nd, for example, as presented in the following Equation (1A).

[Mathematical Formula 2]

$$Ec = \frac{2.49 \times 10^6}{1 - \frac{1}{4}\log_{10}\left(\frac{Nd}{10^{16}}\right)} \text{ (V/cm)} \quad (1A)$$

Incidentally, the buffer layer is a silicon carbide semiconductor layer formed between the silicon carbide epitaxial layer and the silicon carbide wafer. The silicon carbide semiconductor device may not have a buffer layer. In that case, Nb becomes the impurity concentration in the silicon carbide wafer.

On-Resistance Ron

On-resistance Ron of the silicon carbide semiconductor device includes resistance component R1 of the silicon carbide epitaxial wafer and resistance component R2 due to the device structure formed on the silicon carbide epitaxial wafer. Resistance component R1 is mainly resistance (substrate resistance) of the silicon carbide wafer and drift resistance Rdrift generated in the silicon carbide epitaxial layer. In a case in which the silicon carbide semiconductor device is MISFET, resistance component R2 due to the device structure includes contact resistance between the drift electrode (back face electrode) and the silicon carbide substrate, resistance in the source region, resistance in the JFET (Junction FET) region, contact resistance (source contact resistance) between the source electrode and the silicon carbide epitaxial layer, channel resistance and the like.

Silicon carbide semiconductor devices such as MISFET operate at high temperatures, for example, in applications such as applications for vehicles in some cases. When the SiC-MISFET is operated at a high temperature (for example, 175° C.), on-resistance Ron increases as compared with a case in which the SiC-MISFET is operated at room temperature (25° C.). This is because particularly drift resistance Rdrift increases among the resistance components. As a result, at the time of high temperature operation of SiC-MISFET, drift resistance Rdrift occupies 40% or more of the entire on-resistance Ron in some cases.

The proportion of drift resistance Rdrift to the entire on-resistance Ron is high in this manner, it is thus possible to efficiently control on-resistance Ron by controlling drift resistance Rdrift generated in the silicon carbide epitaxial layer.

Drift resistance Rdrift is determined by impurity concentration Nd and thickness td of the silicon carbide epitaxial layer. Specifically, drift resistance Rdrift decreases as impurity concentration Nd in the semiconductor epitaxial layer is higher and as thickness td of the semiconductor epitaxial layer is thinner.

Figure 17B:
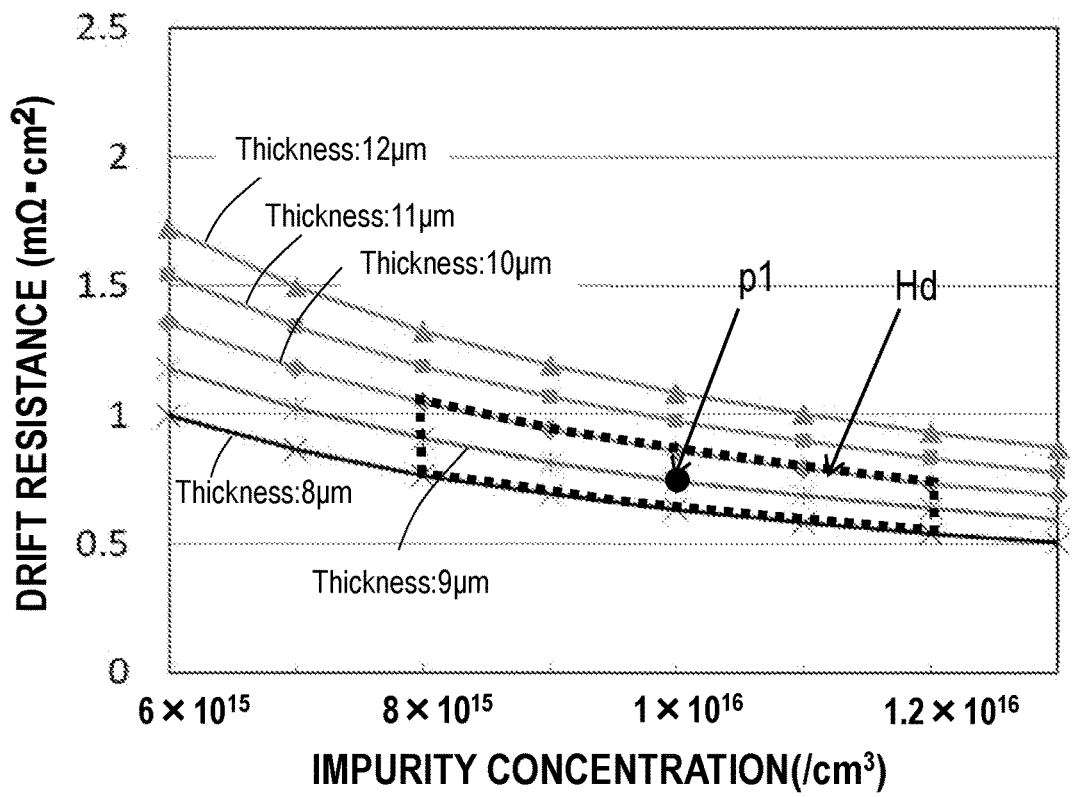
FIG. 17B is a diagram illustrating the relation between the impurity concentration and thickness of a silicon carbide epitaxial layer and the drift resistance of a silicon carbide semiconductor device.

FIG. 17B is a diagram illustrating an example of the relation between impurity concentration Nd and thickness td of the silicon carbide epitaxial layer and drift resistance Rdrift of the silicon carbide semiconductor device. FIG. 17B illustrates the results of drift resistance Rdrift calculated based on the following Equation (2).

[Mathematical Formula 3]

$$R_{drift} = \rho \frac{t_d}{A_{chip}} \quad (2)$$

ρ: resistivity of silicon carbide epitaxial layer
td: thickness of silicon carbide epitaxial layer
A chip: area (chip area) of silicon carbide semiconductor device.

Resistivity ρ in Equation (2) depends on impurity concentration Nd ($\rho = 1/\mu Nd$ (μ: carrier mobility)). Moreover, the carrier mobility μ also depends on impurity concentration Nd. Specifically, the scattering due to impurities increases as impurity concentration Nd increases, and thus the carrier mobility μ decreases. Here, resistivity ρ was calculated from the actually measured value to calculate drift resistance Rdrift.

In-Plane Variation in Device Characteristics

It is known that distribution (in-plane distribution) of impurity concentration Nd and thickness td occurs in the plane of silicon carbide wafer when a silicon carbide epitaxial layer is formed on a silicon carbide wafer. As described above, breakdown voltage $V_{AVA}$ and drift resistance Rdrift of the semiconductor device depend on impurity concentration Nd and thickness td of the silicon carbide epitaxial layer. For this reason, when impurity concentration Nd and thickness td of the silicon carbide epitaxial layer have in-plane distribution, variation (in-plane variation) in breakdown voltage $V_{AVA}$ and drift resistance Rdrift may be caused between the semiconductor devices formed on the silicon carbide wafer or in the semiconductor devices.

When the in-plane variation in device characteristics is large, for example, there is a concern that breakdown voltage $V_{AVA}$ of some silicon carbide semiconductor devices does not satisfy a predetermined value (specification of the semiconductor device) and this causes a decrease in yield. When a silicon carbide semiconductor device is designed so that breakdown voltage $V_{AVA}$ satisfies a predetermined value over the plane of semiconductor wafer in consideration of in-plane variation in device characteristics in order to avoid this, there is a possibility that drift resistance Rdrift increases (that is, on-resistance Ron increases).

Hereinafter, an example of a method for designing a silicon carbide epitaxial layer when a silicon carbide semiconductor device having a specification of a breakdown voltage of 1200 V is manufactured will be described.

Reference is again made to FIGS. 17A and 17B. As indicated by point p1 in the drawing, for example, the design value of thickness td of the silicon carbide epitaxial layer is set to 9 μm and the design value of impurity concentration Nd is set to $1 \times 10^{16}/cm^3$. The target value of breakdown voltage $V_{AVA}$ of the silicon carbide semiconductor device is 1420 V, and the target value of drift resistance Rdrift is 0.7 mΩ·cm².

Actual thickness td of the formed silicon carbide epitaxial layer has in-plane distribution of, for example, ±10% with respect to the designed value, and impurity concentration Nd can have, for example, in-plane distribution of 20% with respect to the designed value. When such in-plane distribution occurs, breakdown voltage $V_{AVA}$ has variations in range Hb of about 1250V to 1600V in the plane of silicon carbide wafer as illustrated in FIG. 17A. Moreover, drift resistance Rdrift has variations in range Hd of about 0.5 mΩ/cm² to about 1.1 mΩ/cm² in the plane of silicon carbide wafer as illustrated in FIG. 17B. In this example, the entire range Hb is equal to or more than 1200 V, and it is thus possible to satisfy a predetermined breakdown voltage (here, 1200 V) over the entire surface of silicon carbide wafer according to the above designed value.

In order to satisfy a predetermined breakdown voltage (1200 V) over the entire surface of silicon carbide wafer in this manner, it is required to set the target value of breakdown voltage $V_{AVA}$ to be sufficiently higher than 1200 V so that the entire range Hd of breakdown voltage variation is equal to or more than 1200 V. In order to increase the target value of breakdown voltage $V_{AVA}$, it is conceivable to increase the designed value of thickness td of the silicon carbide epitaxial layer or decrease the designed value of impurity concentration Nd. However, drift resistance Rdrift increases when thickness td is increased or impurity concentration Nd is decreased. As a result, there is a possibility that on-resistance Ron of the silicon carbide semiconductor device increases and it is difficult to increase the current of the silicon carbide semiconductor device and to form the silicon carbide semiconductor device into a small chip. This can be a factor to cause an increase in device cost.

In order to diminish variations in device characteristics, it is preferable to form a more uniform silicon carbide epitaxial layer in the plane of silicon carbide wafer. For example, the above-mentioned PTL 1 discloses that the in-plane uniformity of impurity concentration and thickness is enhanced by performing feedback control of the source gas flow rate based on the rotation speed of the silicon carbide wafer when silicon carbide is epitaxially grown.

However, as a result of investigations by the present inventors, there is a limit even when it is attempted to diminish the in-plane distribution of impurity concentration and thickness occurring in the silicon carbide epitaxial layer by the epitaxial growth method and growth conditions. In particular, as the maximum diameter of silicon carbide wafer increases (for example, 6 inches or more or 8 inches or more), it is more difficult to suppress the in-plane distribution of impurity concentration and thickness low. Incidentally, this problem can also arise in semiconductor devices using semiconductors other than silicon carbide.

Hence, the present inventors have investigated a method that can diminish the in-plane variation in device characteristics caused by the in-plane distribution even when the thickness and impurity concentration in a semiconductor epitaxial layer (such as a silicon carbide epitaxial layer) have in-plane distribution. As a result, the present inventors have found out that in-plane variations in device characteristics such as breakdown voltage and on-resistance Ron can be diminished by controlling the correlation between the in-plane distribution of the thickness of the semiconductor epitaxial layer and the in-plane distribution of the impurity concentration. According to an aspect of the present disclosure, as the in-plane distribution of the thickness of the semiconductor epitaxial layer and the in-plane distribution of the impurity concentration have a positive correlation, it is possible to cancel out the fluctuation portion in the device characteristics due to the in-plane distribution of the thickness and the fluctuation portion in the device characteristics due to the in-plane distribution of the impurity concentration each other. Hence, a semiconductor epitaxial wafer or a semiconductor device having diminished in-plane variations in device characteristics is provided.

The overview of an aspect of the present disclosure is as follows.

A semiconductor epitaxial wafer according to an exemplary embodiment of the present disclosure includes a semiconductor wafer and a first conductivity type semiconductor epitaxial layer. The semiconductor epitaxial layer is disposed on the principal surface of the semiconductor wafer and contains a first conductivity type impurity. The thickness distribution of the semiconductor epitaxial layer and the concentration distribution of the impurity in the semiconductor epitaxial layer have a positive correlation in a plane parallel to the principal surface of the semiconductor wafer.

In an exemplary embodiment, when the maximum thickness in the thickness distribution of the semiconductor epitaxial layer is denoted as Tmax, the minimum thickness is denoted as Tmin, and the average thickness is denoted as Tave, width VT (%) of the thickness distribution with respect to average thickness Tave is expressed by the following Equation (3).

$$VT=[\{(Tmax-Tmin)/2\}/Tave] \times 100(\%) \quad (3)$$

In addition, when the maximum concentration in the concentration distribution in the semiconductor epitaxial layer is denoted as Cmax, the minimum concentration is denoted as Cmin, and the average concentration is denoted as Cave, width VC (%) of the concentration distribution with respect to average concentration Cave is expressed by the following Equation (4).

$$VC=[\{(Cmax-Cmax)/2\}/Cave] \times 100(\%) \quad (4)$$

Width VT of the thickness distribution may be from 5% to 20%, inclusive, and width VC of the concentration distribution may be from 10% to 40%, inclusive.

In an exemplary embodiment, width VT of the thickness distribution and width VC of the concentration distribution in the semiconductor epitaxial layer satisfy, for example, 0.5≤VC/VT≤3.0.

In an exemplary embodiment, width VT of the thickness distribution and width VC of the concentration distribution in the semiconductor epitaxial layer satisfy, for example, 1.0≤VC/VT≤2.5.

In an exemplary embodiment, when the thicknesses of the semiconductor epitaxial layer at two points a and b in a plane parallel to the principal surface of the semiconductor wafer are denoted as Da and Db, respectively and the concentrations of the impurity in the semiconductor epitaxial layer at the two points a and b are denoted as Ca and Cb, respectively, it may be Ca>Cb when Da>Db or Ca<Cb when Da<Db.

In an exemplary embodiment, the thickness of the semiconductor epitaxial layer in a plane parallel to the principal surface of the semiconductor wafer may be thinner at the central portion of the semiconductor wafer than at the peripheral edge portion and the concentration of impurity in the semiconductor epitaxial layer may be lower at the central portion of the semiconductor wafer than at the peripheral edge portion.

In an exemplary embodiment, the thickness of the semiconductor epitaxial layer in a plane parallel to the principal surface of the semiconductor wafer may be thicker at the central portion of the semiconductor wafer than at the peripheral edge portion and the concentration of impurity in the semiconductor epitaxial layer may be higher at the central portion of the semiconductor wafer than at the peripheral edge portion.

In an exemplary embodiment, average concentration Cave in the semiconductor epitaxial layer is, for example, from $3\times10^{15}/cm^3$ to $3\times10^{16}/cm^3$, inclusive and average thickness Tave is, for example, from 4 μm to 40 μm, inclusive.

In an exemplary embodiment, the semiconductor epitaxial wafer may have a plurality of device regions. Each of the plurality of device regions may include a semiconductor device having a second conductivity type body region in contact with the semiconductor epitaxial layer, a first conductivity type source region in contact with the body region, and a gate electrode disposed on the semiconductor epitaxial layer via a gate insulating film.

In an exemplary embodiment, the semiconductor epitaxial wafer may have a plurality of device regions. Each of the plurality of device regions may include a semiconductor device having a first electrode that is disposed on the semiconductor epitaxial layer and is in contact with the semiconductor epitaxial layer and a second electrode that is disposed on a surface on a side opposite to the principal surface of the semiconductor wafer and is in contact with the semiconductor wafer.

In an exemplary embodiment, when the maximum value of the avalanche breakdown voltage of the semiconductor device in each of the plurality of device regions is denoted as Bmax, the minimum value is denoted as Bmin, and the average value is denoted as Bave, width VB (%) with respect to average value Bave of the variations in avalanche breakdown voltage of the semiconductor device between the plurality of device regions is expressed by the following Equation (5).

$$VB(\%)=[\{(B\max-B\min)/2\}/Bave]\times 100 \quad (5)$$

When the maximum value of a drift resistance of the semiconductor device in each of the plurality of device regions is denoted as Dmax, the minimum value is denoted as Dmin, and the average value is denoted as Dave, width VD (%) with respect to average value Dave of variations in drift resistance of the semiconductor device between the plurality of device regions is expressed by the following Equation (6).

$$VD(\%)=[\{(D\max-D\min)/2\}/Dave]\times 100 \quad (6)$$

Width VB and width VD may be from 0% to 10%, inclusive.

In an exemplary embodiment, the semiconductor wafer may be a silicon carbide wafer and the semiconductor epitaxial layer may be a silicon carbide semiconductor layer.

A semiconductor device according to an exemplary embodiment of the present disclosure includes a semiconductor substrate, a semiconductor epitaxial layer, a body region, a source region, a gate insulating film, and a gate electrode. The semiconductor epitaxial layer is disposed on the principal surface of the semiconductor substrate and is of a first conductivity type containing a first conductivity type impurity. The body region is in contact with the semiconductor epitaxial layer and is of a second conductivity type. The source region is in contact with the body region and is of a first conductivity type. The gate electrode is disposed on the semiconductor epitaxial layer via a gate insulating film. The thickness distribution of the semiconductor epitaxial layer and the concentration distribution of the impurity in the semiconductor epitaxial layer have a positive correlation in a plane parallel to the principal surface of the semiconductor substrate.

A semiconductor device according to another exemplary embodiment of the present disclosure includes a semiconductor substrate, a semiconductor epitaxial layer, a first electrode, and a second electrode. The semiconductor epitaxial layer is disposed on the principal surface of the semiconductor substrate and is of a first conductivity type containing a first conductivity type impurity. The first electrode is disposed on the semiconductor epitaxial layer and is in contact with the semiconductor epitaxial layer. The second electrode is disposed on the surface on a side opposite to the principal surface of the semiconductor substrate and is in contact with the semiconductor substrate. The thickness distribution of the semiconductor epitaxial layer and the concentration distribution of the impurity in the semiconductor epitaxial layer have a positive correlation in a plane parallel to the principal surface of the semiconductor substrate.

A method for manufacturing a semiconductor epitaxial wafer according to an exemplary embodiment of the present disclosure includes (A) a step of preparing a semiconductor wafer and (B) a step of forming a first conductivity type semiconductor epitaxial layer containing a first conductivity type impurity by epitaxially growing a semiconductor on a principal surface of the semiconductor wafer. In step (B), the condition for epitaxial growth is controlled so that the thickness distribution of the semiconductor epitaxial layer and the concentration distribution of the impurity in the semiconductor epitaxial layer have a positive correlation in a plane parallel to the principal surface of the semiconductor wafer.

In an exemplary embodiment, when the maximum thickness in the thickness distribution of the semiconductor epitaxial layer is denoted as Tmax, the minimum thickness is denoted as Tmin, and the average thickness is denoted as Tave, width VT (%) of the thickness distribution with respect to average thickness Tave is expressed by the following Equation (7).

$$VT=[\{(T\max-T\min)/2\}/Tave]\times 100(\%) \quad (7)$$

When the maximum concentration in the concentration distribution in the semiconductor epitaxial layer is denoted as Cmax, the minimum concentration is denoted as Cmin, and the average concentration is denoted as Cave, width VC (%) of the concentration distribution with respect to average concentration Cave is expressed by the following Equation (8).

$$VC = [\{(Cmax - Cmin)/2\}/Cave] \times 100(\%) \quad (8)$$

In step (B), the condition for epitaxial growth may be controlled so that width VT of the thickness distribution is from 5% to 20%, inclusive, and width VC of the concentration distribution is from 10% to 40%, inclusive.

In an exemplary embodiment, the condition for epitaxial growth is controlled in step (B) so that width VT of the thickness distribution and width VC of the concentration distribution in the semiconductor epitaxial layer satisfy $0.5 \leq VC/VT \leq 3.0$.

In an exemplary embodiment, the condition for epitaxial growth is controlled in step (B) so that width VT of the thickness distribution and width VC of the concentration distribution in the semiconductor epitaxial layer satisfy $1.0 \leq VC/VT \leq 2.5$.

In an exemplary embodiment, the semiconductor wafer may be a silicon carbide wafer and the semiconductor epitaxial layer may be a silicon carbide semiconductor layer.

First Exemplary Embodiment

Hereinafter, the first exemplary embodiment of a semiconductor epitaxial wafer and a semiconductor device will be described by taking a silicon carbide epitaxial wafer and a silicon carbide semiconductor device (MISFET) as examples with reference to the drawings. Here, a MISFET having n-type conductivity as the first conductivity type and p-type conductivity as the second conductivity type will be described as an example. However, the silicon carbide semiconductor device of the present exemplary embodiment may be a MISFET having p-type conductivity as the first conductivity type and an n-type conductivity as the second conductivity type.

Figure 1:
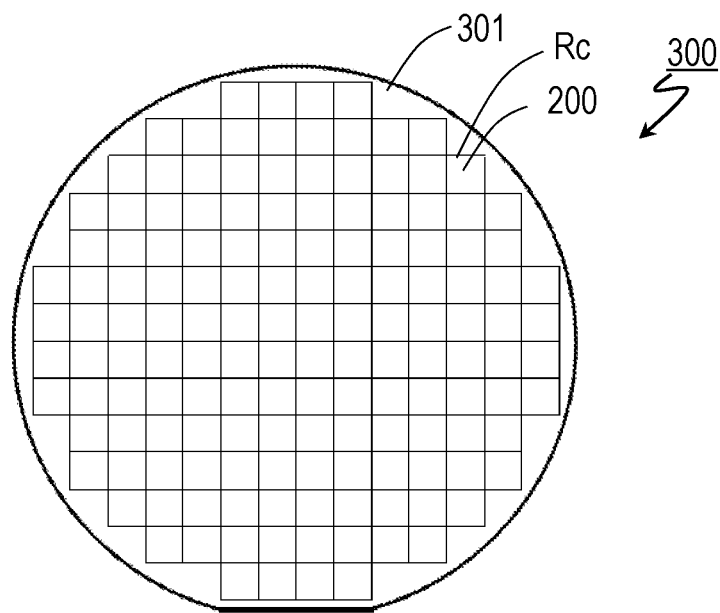
FIG. 1 is a plan view illustrating a silicon carbide epitaxial wafer.

FIG. 1 is a plan view illustrating silicon carbide epitaxial wafer 300 of the present exemplary embodiment. Silicon carbide epitaxial wafer 300 includes first conductivity type silicon carbide wafer 301 and a silicon carbide semiconductor layer (not illustrated) disposed on silicon carbide wafer 301. The silicon carbide semiconductor layer is an epitaxial layer formed by epitaxial growth. The diameter of silicon carbide wafer 301 may be, for example, equal to or more than 3 inches or less than or equal to 6 inches. Silicon carbide epitaxial wafer 300 has a plurality of device regions Rc arranged in a two-dimensional manner. In each device region Rc, the whole or a part of silicon carbide semiconductor device 200 may be formed.

Figure 2:
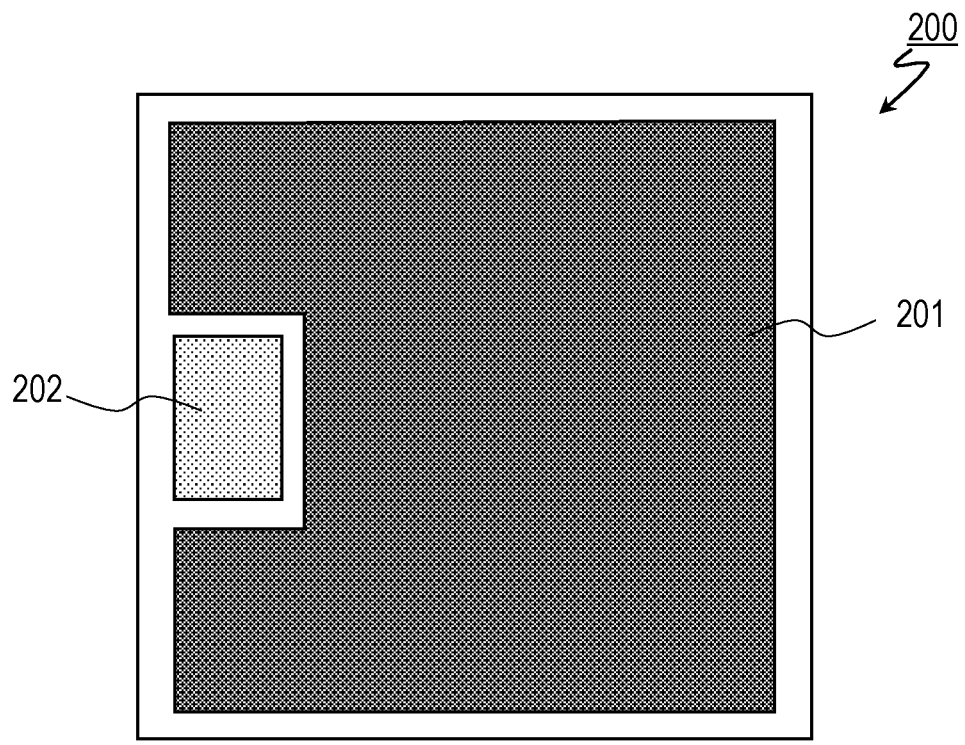
FIG. 2 is a plan view illustrating a silicon carbide semiconductor device.

FIG. 2 is a plan view illustrating silicon carbide semiconductor device 200. Each silicon carbide semiconductor device 200 is composed of a plurality of unit cells (not illustrated) arranged in a two-dimensional manner. In each silicon carbide semiconductor device 200, source pad 201 and gate pad 202 are provided above the plurality of unit cells on the principal surface side of silicon carbide wafer 301. Source pad 201 and gate pad 202 are insulated from each other. Incidentally, in the present specification, a region in which each unit cell is formed in silicon carbide semiconductor device 200 may be referred to as "unit cell-formed region Ru".

Figure 3:
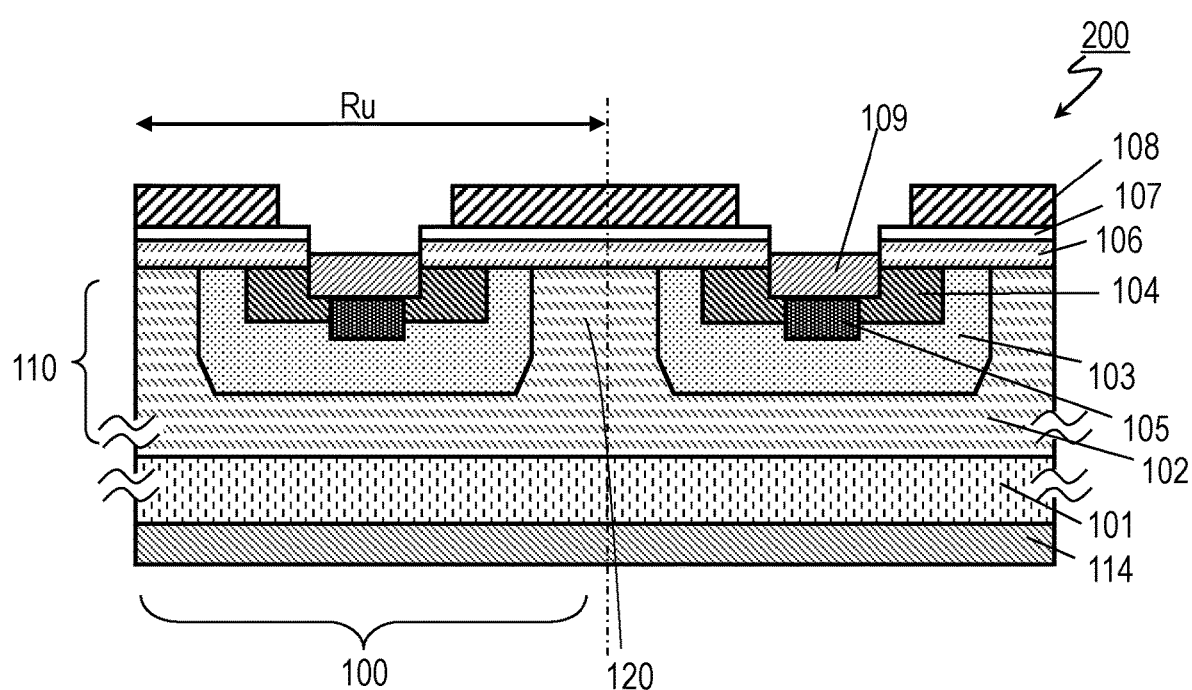
FIG. 3 is a cross-sectional view illustrating a unit cell in a silicon carbide semiconductor device.

FIG. 3 is a cross-sectional view illustrating two unit cells 100 in silicon carbide semiconductor device 200.

Each unit cell 100 includes first conductivity type silicon carbide semiconductor substrate (hereinafter simply referred to as "silicon carbide substrate") 101 and silicon carbide epitaxial layer (drift layer) 110 disposed on the principal surface of silicon carbide substrate 101.

Silicon carbide substrate 101 is a part of silicon carbide wafer 301. Silicon carbide substrate 101 is, for example, an n$^+$ substrate (n$^+$ SiC substrate).

Second conductivity type body region 103 is disposed on silicon carbide epitaxial layer 110. The region in which body region 103 is not disposed, of silicon carbide epitaxial layer 110 is first conductivity type drift region 102. Of the surface portion of drift region 102, region 120 sandwiched between two adjacent body regions 103 functions as a JFET region. In the present exemplary embodiment, drift region 102 is of n$^-$-type, and body region 103 is of p-type. The impurity concentration and thickness of drift region 102 are appropriately changed depending on the breakdown voltage required for a semiconductor device.

In the present exemplary embodiment, the first conductivity type is n-type and the second conductivity type is p-type, but the n-type and p-type may be interchanged. Incidentally, the superscript "+" or "−" in the symbol "n$^+$" or "n$^-$" represents a relative concentration of dopant. The symbol "n$^+$" means that the n-type impurity concentration is higher than the n-type impurity concentration denoted by a symbol "n". The symbol "n$^-$" means that the n-type impurity concentration is lower than the n-type impurity concentration denoted by the symbol "n".

First conductivity type (here, n$^+$-type) source region 104 is disposed in body region 103. Second conductivity type (here, p$^+$-type) contact region 105 is also disposed in body region 103. Contact region 105 is formed in order to decrease the contact resistance between body region 103 and source electrode 109. Incidentally, contact region 105 may not be formed. In that case, a part of body region 103 is configured to be in direct contact with source electrode 109.

Source electrode 109 is provided on source region 104. Source electrode 109 is in electrical contact with both the n$^+$ type source region 104 and the p$^+$ type contact region 105.

Channel layer 106 may be formed on silicon carbide epitaxial layer 110 to be in contact with body region 103. Channel layer 106 is mainly composed of a silicon carbide semiconductor and contains a first conductivity type impurity. Channel layer 106 is formed so as to link source region 104 and JFET region 120 to each other. Channel layer 106 may be formed on, for example, silicon carbide epitaxial layer 110 by epitaxial growth. A portion of channel layer 106, which is located between body region 103 and gate electrode 108 and is in contact with body region 103, functions as a channel region. Incidentally, channel layer 106 may not be formed.

Gate insulating film 107 is disposed on silicon carbide epitaxial layer 110 (on channel layer 106 in a case in which channel layer 106 is formed). The thickness of gate insulating film 107 is appropriately selected depending on the voltage applied to gate electrode 108. Gate electrode 108 is provided on gate insulating film 107. Gate electrode 108 is disposed so as to cover at least a portion of the surface of body region 103 located between JFET region 120 and source region 104.

Gate electrodes 108 of the plurality of unit cells 100 are, for example, integrally formed and are electrically connected to each other. Gate electrode 108 is electrically connected to gate pad 202 illustrated in FIG. 2. A source wire is provided on source electrode 109 although not illustrated. Source electrodes 109 of the plurality of unit cells 100 are electrically connected to each other by source wire. The source wire is electrically connected to source pad 201 illustrated in FIG. 2. On the other hand, drain electrode 114 is disposed on the back surface of silicon carbide substrate 101.

Relation Between Thickness Distribution and Impurity Concentration Distribution in Silicon Carbide Epitaxial Layer 110

In silicon carbide epitaxial wafer 300 of the present exemplary embodiment, the thickness distribution and impurity concentration distribution in silicon carbide epitaxial layer 110 have a positive correlation in the plane of silicon carbide wafer 301. In addition, in each silicon carbide semiconductor device 200 formed on the silicon carbide epitaxial wafer, the thickness distribution and impurity concentration distribution in silicon carbide epitaxial layer 110 have a positive correlation in the plane of silicon carbide substrate 101.

The "positive correlation" refers to a case in which Ca>Cb when Da>Db, or Ca<Cb when Da<Db, for example, when two points a and b having different thicknesses of silicon carbide epitaxial layer 110 are taken in a plane parallel to silicon carbide wafer 301 or silicon carbide substrate 101 and the thicknesses of silicon carbide epitaxial layer 110 at the points a and b are denoted as Da and Db, respectively and the concentrations of the first conductivity type impurity in silicon carbide epitaxial layer 110 are denoted as Ca and Cb, respectively.

The breakdown voltage and drift resistance increase when silicon carbide epitaxial layer 110 is thick, and the breakdown voltage and drift resistance decrease when the impurity concentration in silicon carbide epitaxial layer 110 is high. Hence, when the impurity concentration is set to be higher at the thicker point of silicon carbide epitaxial layer 110 than at the other point among the two points a and b in the plane, the fluctuation amounts of breakdown voltage and drift resistance generated between the two points a and b due to the thickness distribution is compensated by the fluctuation amounts generated between the two points a and b due to the impurity concentration distribution, respectively. As a result, the difference (absolute value) in breakdown voltage and the difference (absolute value) in drift resistance between the two points a and b can be decreased.

According to the present exemplary embodiment, in silicon carbide epitaxial wafer 300 or silicon carbide semiconductor device 200, it is possible to cancel out the breakdown voltage and drift resistance fluctuation portions due to the thickness distribution of silicon carbide epitaxial layer 110 and the breakdown voltage and drift resistance fluctuation portions due to the impurity concentration distribution in silicon carbide epitaxial layer 110 each other in this manner. For this reason, it is possible to diminish variations in device characteristics due to the in-plane distribution of the thickness and impurity concentration in silicon carbide epitaxial layer 110. Incidentally, the "cancellation" here may not completely cancel out the breakdown voltage and drift resistance fluctuation portions due to the thickness distribution of silicon carbide epitaxial layer 110 and the breakdown voltage and drift resistance fluctuation portions due to the impurity concentration distribution in silicon carbide epitaxial layer 110 each other. It is only required that one of these parameters is compensated by the other, and as a result, the total fluctuation amount of the breakdown voltage and the fluctuation amount of the drift resistance decrease. In the present exemplary embodiment, it is possible to diminish in-plane variations in device characteristics even in a case in which the thickness and impurity concentration in silicon carbide epitaxial layer 110 have relatively large in-plane distribution (distribution widths VT and VB to be described later are 5% or more).

Conventionally, as described above with reference to FIGS. 17A and 17B, there has been a case in which a relatively large margin is set in consideration of in-plane variations in device characteristics when a device is designed. For example, in order to secure breakdown voltage over the entire surface of the silicon carbide wafer, there has been a case in which the impurity concentration in the silicon carbide epitaxial layer is set to be low or the thickness is set to be thick, and there has been a concern that on-resistance Ron increases. On the other hand, in the present exemplary embodiment, the in-plane variations in device characteristics are diminished and thus the margin can be decreased. Consequently, it is possible to secure a predetermined breakdown voltage while suppressing an increase in on-resistance Ron. On-resistance Ron is decreased, thus silicon carbide semiconductor device 200 can have a large current and be formed into a small chip, and the device cost can be cut down.

Figure 4A:
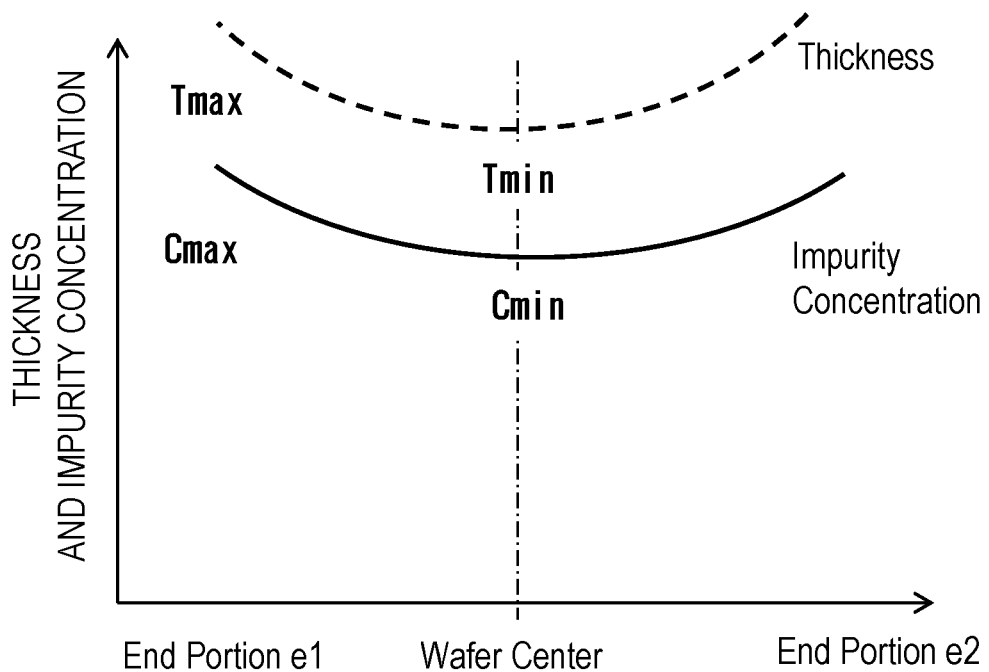
FIG. 4A is a diagram illustrating the distribution of the thickness and impurity concentration in a silicon carbide epitaxial layer on a straight line passing through the center of a silicon carbide epitaxial wafer.
Figure 4B:
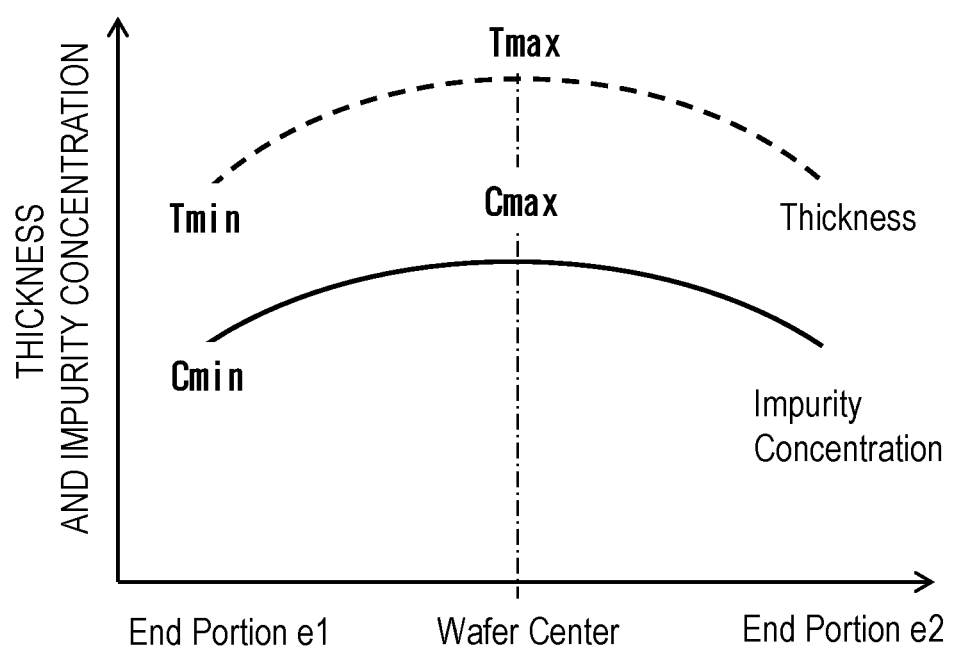
FIG. 4B is a diagram illustrating the distribution of the thickness and impurity concentration in a silicon carbide epitaxial layer on a straight line passing through the center of a silicon carbide epitaxial wafer.
Figure 4C:
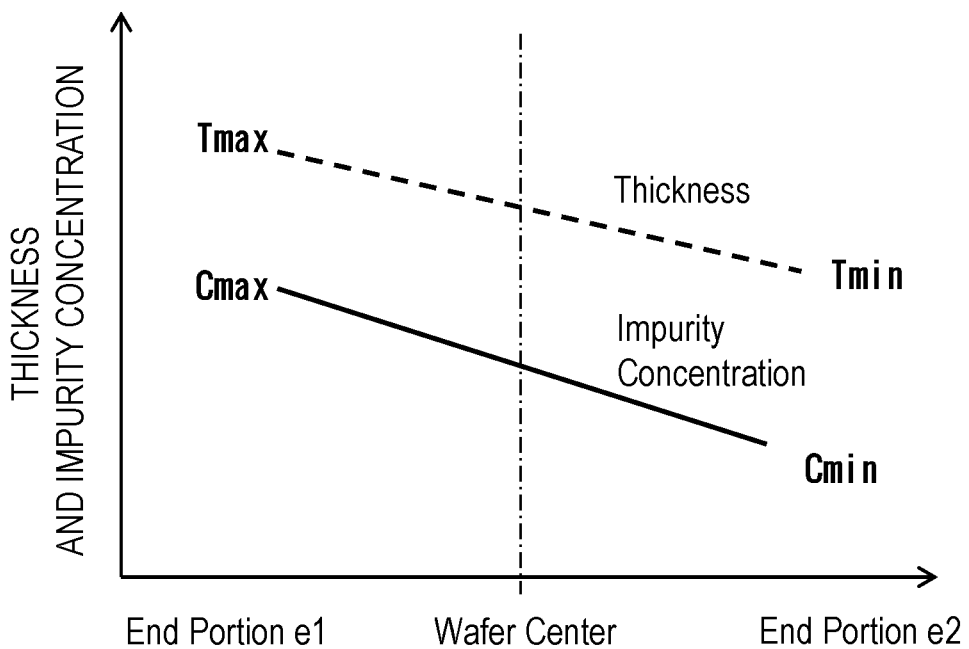
FIG. 4C is a diagram illustrating the distribution of the thickness and impurity concentration in a silicon carbide epitaxial layer on a straight line passing through the center of a silicon carbide epitaxial wafer.
Figure 5:
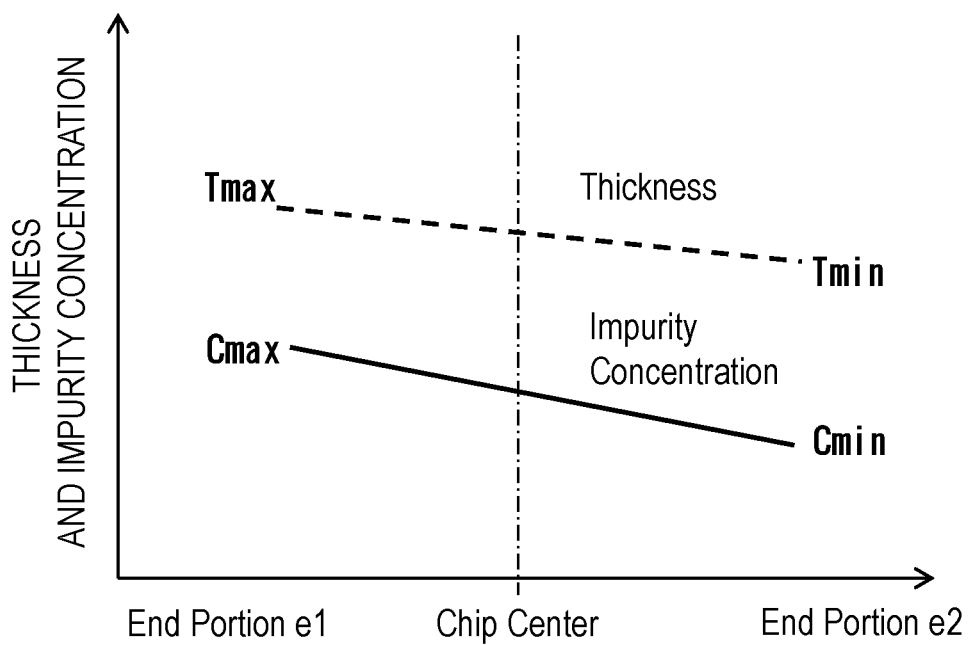
FIG. 5 is a diagram illustrating the distribution of the thickness and impurity concentration in a silicon carbide epitaxial layer on a straight line passing through the center of a silicon carbide semiconductor device.

FIGS. 4A to 4C are each a schematic view illustrating the distribution of the thickness and impurity concentration in silicon carbide epitaxial layer 110 on a straight line passing through the center of silicon carbide epitaxial wafer 300. FIG. 5 is a schematic view illustrating the distribution of the thickness and impurity concentration in silicon carbide epitaxial layer 110 on a straight line passing through the center of silicon carbide semiconductor device 200.

As illustrated in FIG. 4A, in the plane of silicon carbide wafer 301, the thickness of silicon carbide epitaxial layer 110 may have concentric distribution to be thinner at the central portion than at the peripheral edge portion and the impurity concentration in silicon carbide epitaxial layer 110 may have concentric distribution to be lower at the central portion than at the peripheral edge portion. In the present specification, the shape of the concentric distribution having a lower value at the central portion than at the peripheral edge portion is referred to as "concave shape". In this example, minimum thickness Tmin and minimum concentration Cmin are located near the central portion of the silicon carbide wafer and maximum thickness Tmax and maximum concentration Cmax are located near the peripheral edge portion of the silicon carbide wafer.

As illustrated in FIG. 4B, in the plane of silicon carbide wafer 301, the thickness of silicon carbide epitaxial layer 110 may have concentric distribution to be thicker at the central portion than at the peripheral edge portion and the impurity concentration in silicon carbide epitaxial layer 110 may have concentric distribution to be higher at the central portion than at the peripheral edge portion. In the present specification, the shape of the concentric distribution having a higher value at the central portion than at the peripheral edge portion is referred to as "convex shape". In this example, minimum thickness Tmin and minimum concentration Cmin are located near the peripheral edge portion of the silicon carbide wafer and maximum thickness Tmax and maximum concentration Cmax are located near the central portion of the silicon carbide wafer.

The distribution of thickness and impurity concentration may not be concentric. It is only required to have at least one direction in which the thickness distribution and impurity concentration distribution in silicon carbide epitaxial layer 110 have a positive correlation in the plane of silicon carbide wafer 301. For example, as illustrated in FIG. 4C, the impurity concentration in silicon carbide epitaxial layer 110 may have distribution to decrease from one end portion e1 toward the other end portion e2 and the thickness in silicon carbide epitaxial layer 110 may have distribution to be thinner from end portion e1 toward end portion e2. In other words, maximum thickness Tmax and maximum concentration Cmax are located near end portion e1 of silicon carbide wafer 301, and minimum thickness Tmin and minimum concentration Cmin are located near end portion e2 of silicon carbide wafer 301.

In silicon carbide semiconductor device 200 as well, it is only required to have at least one direction in which the thickness distribution and impurity concentration distribution in channel layer 106 have a positive correlation in the plane of silicon carbide substrate 101 in the same manner. For example, as illustrated in FIG. 5, the thickness in silicon carbide epitaxial layer 110 may have distribution to be thinner from one end portion e3 toward the other end portion e4 and the impurity concentration in silicon carbide epitaxial layer 110 may have distribution to decrease from end portion e3 toward end portion e4.

In the present specification, the magnitudes of the thickness distribution and impurity concentration distribution in silicon carbide epitaxial layer 110 in the plane of silicon carbide wafer 301 are represented by in-plane distribution widths VT and VC (%) with respect to the average values, respectively. When the maximum thickness in the thickness distribution is denoted as Tmax, the minimum thickness is denoted as Tmin, and the average thickness is denoted as Tave, width VT (%) of the thickness distribution is expressed by, for example, the following Equation (9).

$$VT(\%)=[\{(Tmax-Tmin)/2\}/Tave]\times 100(\%) \quad (9)$$

In the same manner, when the maximum concentration in the impurity concentration distribution is denoted as Cmax, the minimum concentration is denoted as Cmin, and the average concentration is denoted as Cave, width VC (%) of the impurity concentration distribution is expressed by, for example, the following Equation (10).

$$VC(\%)=[\{(Cmax-Cmin)/2\}/Cave]\times 100(\%) \quad (10)$$

Incidentally, in the case of a silicon carbide device having a breakdown voltage of, for example, 600V to 3300V, average concentration Cave in silicon carbide epitaxial layer 110 is, for example, from $3\times10^{15}/cm^3$ to $3\times10^{16}/cm^3$, inclusive. Average thickness Tave of silicon carbide epitaxial layer 110 is, for example, from 4 μm to 40 μm, inclusive.

Moreover, in the present specification, the magnitudes of variations (in-plane variations) in breakdown voltage and drift resistance between silicon carbide semiconductor devices 200 formed on silicon carbide epitaxial wafer 300, namely, between the plurality of device regions Rc are represented by widths (hereinafter abbreviated as "variation widths") VB and VD (%) of in-plane variations with respect to the average values, respectively. When the maximum value of breakdown voltage in each of the plurality of device regions Rc is denoted as Bmax, the minimum value is denoted as Bmin, and the average value is denoted as Bave, variation width VB of the breakdown voltage is expressed by the following Equation (11).

$$VB(\%)=[\{(Bmax-Bmin)/2\}/Bave]\times 100(\%) \quad (11)$$

In the same manner, when the maximum value of drift resistance in each of the plurality of device regions Rc is denoted as Dmax, the minimum value is denoted as Dmin, and the average value is denoted as Dave, variation width VD of the drift resistance is expressed by the following Equation (12).

$$VD(\%)=[\{(Dmax-Dmin)/2\}/Dave]\times 100(\%) \quad (12)$$

It is preferable that width VT of the thickness distribution is, for example, from 5% to 20%, inclusive and width VC of the concentration distribution is, for example, from 10% to 40%, inclusive. If widths VT and VC of the in-plane distribution of the thickness and impurity concentration are in the above ranges, respectively, the fluctuation amounts of the breakdown voltage and drift resistance can be more effectively compensated by each other. As a result, variation widths VB and VD of the breakdown voltage and drift resistance can be decreased. Variation width VB of the breakdown voltage is preferably, for example, from 0% to 10%, inclusive. Variation width VD of the drift resistance is preferably, for example, from 0% to 10%, inclusive.

Here, the same effect is attained even when width VT of the thickness distribution is less than 5% and width VC of the concentration distribution is less than 10%. However, it is required to extremely strictly adjust and manage the epitaxial growth apparatus in order to suppress width VT of the thickness distribution to less than 5% and width VC of the concentration distribution to less than 10%. Moreover, in this case, when the state of the epitaxial growth apparatus changes during the epitaxial growth process, there is a concern that the relation between the thickness distribution and impurity concentration distribution in channel layer 106 is likely to change from a positive correlation to a negative correlation, and it is difficult to control the correlation in some cases. On the other hand, if width VT of the thickness distribution is equal to or more than 5% and width VC of the concentration distribution is equal to or more than 10%, the relation between the thickness distribution and the impurity concentration distribution can be controlled with favorable reproducibility. For example, even in a case in which the state of the epitaxial growth apparatus changes during the epitaxial growth process, the positive correlation between the thickness distribution and impurity concentration distribution in channel layer 106 is maintained, and thus variation width VB of the breakdown voltage and variation width VD of the drift resistance can be more reliably suppressed.

Relation Between Width VT of Thickness Distribution and Width VC of Impurity Concentration Distribution By controlling the relation between width VT of thickness distribution and width VC of impurity concentration distribution in silicon carbide epitaxial layer 110, it is possible to more efficiently cancel out the fluctuation amounts of the device characteristics each other. The results of investigations on the relation between these distribution widths VT and VC by the present inventor will be described below.

Figure 6:
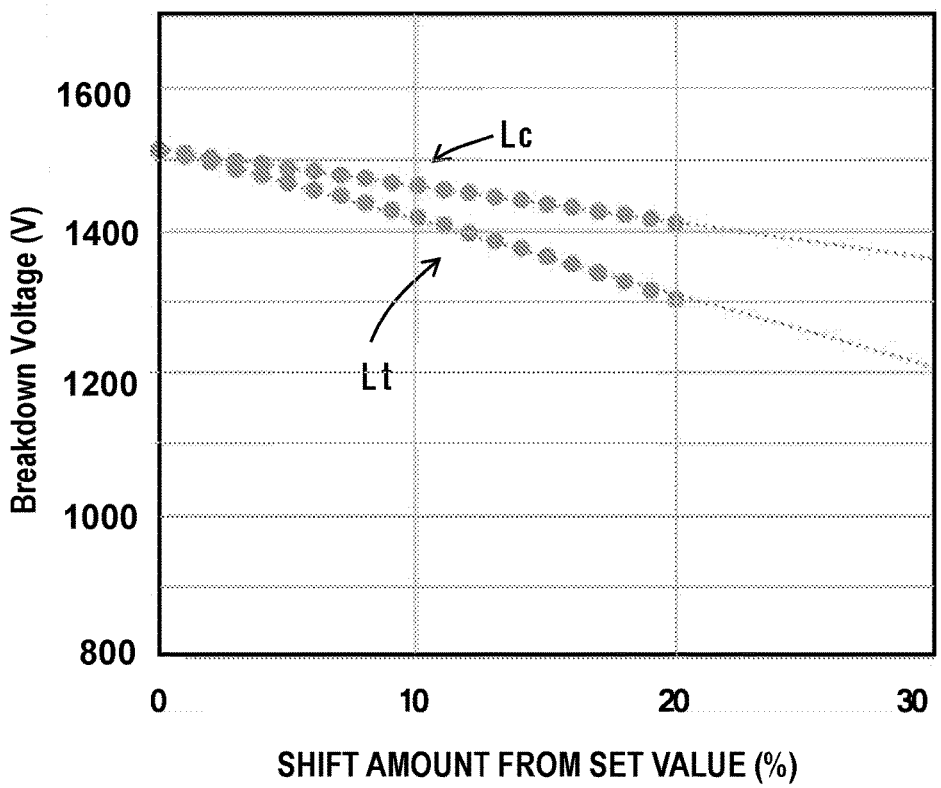
FIG. 6 is a diagram illustrating the relation between the shift amounts of thickness and impurity concentration in a silicon carbide epitaxial layer from set values and the breakdown voltage of a silicon carbide semiconductor device.

FIG. 6 is a diagram illustrating the relation between the shift amounts (%) of thickness and impurity concentration in silicon carbide epitaxial layer 110 from the set values and the breakdown voltage of silicon carbide semiconductor device. FIG. 6 illustrates the results calculated using the above-described Equation (1).

Line Lt in the drawing indicates the relation between the shift amount and the breakdown voltage in a case in which the thickness is shifted in the direction in which the breakdown voltage decreases, namely, in the direction in which the thickness is decreased. Line Lc illustrates the relation between the shift amount and the breakdown voltage in a case in which the impurity concentration is shifted in the direction in which the breakdown voltage decreases, namely, in the direction in which the impurity concentration is increased.

From the calculation result illustrated in FIG. 6, it can be seen that the slope of line Lt is greater (about two times) than the slope of line Lc and the fluctuation amount of breakdown voltage due to the shift amount of thickness is greater than the fluctuation amount of breakdown voltage due to the shift amount of impurity concentration.

Figure 7:
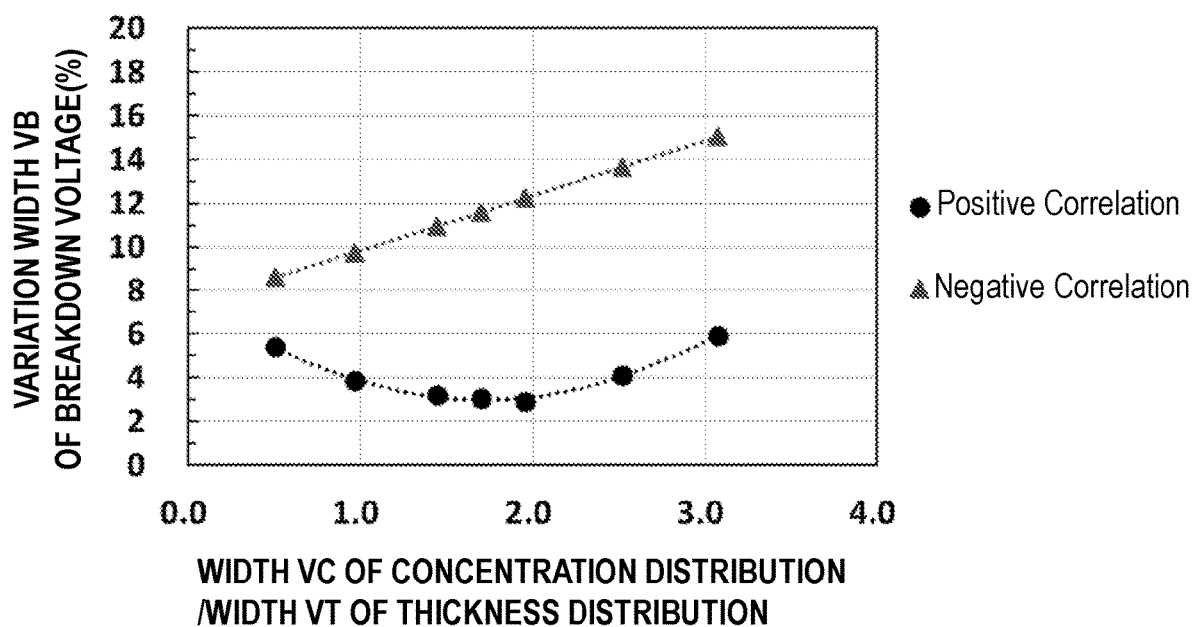
FIG. 7 is a diagram illustrating the relation between ratio VC/VT of width VC of impurity concentration distribution to width VT of thickness distribution and variation width VB of breakdown voltage.

FIG. 7 is a diagram illustrating the relation between ratio VC/VT of width VC of the impurity concentration distribution to width VT of the thickness distribution and variation width VB of the breakdown voltage. The horizontal axis represents ratio (hereinafter, "ratio of distribution width") VC/VT of width VC of the impurity concentration distribution to width VT of the thickness distribution when width VT of the thickness distribution is 10% (constant). Here, variation width VB of the breakdown voltage is calculated by varying ratio VC/VT of the distribution width in both cases in which the in-plane distribution of thickness and the in-plane distribution of impurity concentration have a positive correlation and a negative correlation.

As can be seen from the results illustrated in FIG. 7, as the in-plane distribution of thickness and the in-plane distribution of impurity concentration have a positive correlation, variation width VB of the breakdown voltage can be decreased as compared with the case of having a negative correlation.

In the case of having a negative correlation, variation width VB of the breakdown voltage increases as ratio VC/VT of the distribution width increases. The reason for this is considered as follows. In a case in which the in-plane distribution of thickness and the in-plane distribution of impurity concentration have a negative correlation, the absolute value of the fluctuation amount of the breakdown voltage due to the impurity concentration distribution is added to the absolute value (here, it is constant since width VT of the thickness distribution is 10% (constant)) of the fluctuation amount of the breakdown voltage due to the thickness distribution. For this reason, as ratio VC/VT of the distribution width increases (that is, as width VC of the impurity concentration distribution increases), the fluctuation amount of breakdown voltage due to the impurity concentration distribution increases, and as a result, variation width VB of the breakdown voltage increases.

On the other hand, in a case in which the in-plane distribution of thickness and the in-plane distribution of impurity concentration have a positive correlation, the fluctuation amount of the breakdown voltage due to the impurity concentration distribution is compensated by the fluctuation amount (constant) of the breakdown voltage due to the thickness distribution. For this reason, as ratio VC/VT of the distribution width increases (that is, as width VC of the impurity concentration distribution increases), variation width VB of the breakdown voltage gradually decreases and becomes minimum when ratio VC/VT of the distribution width is about 2. This is considered to be because when ratio VC/VT of the distribution width is about 2, the fluctuation amount of the breakdown voltage due to the impurity concentration distribution is efficiently compensated by the fluctuation amount of the breakdown voltage due to the thickness distribution (see FIG. 6). As ratio VC/VT of the distribution width further increases, the fluctuation amount of the breakdown voltage due to the impurity concentration distribution becomes excessive with respect to the fluctuation amount of the breakdown voltage due to the thickness distribution, and thus variation width VB of the breakdown voltage increases.

Furthermore, as can be seen from the results illustrated in FIG. 7, variation width VB of the breakdown voltage can be decreased to 10% or less (6% or less in this calculation example) as the in-plane distribution of thickness and the in-plane distribution of impurity concentration have a positive correlation and ratio VC/VT of the distribution width between the thickness and the impurity concentration is controlled to, for example, from 0.5 to 3.0, inclusive (0.5≤VC/VT≤3.0). Furthermore, variation width VB of the breakdown voltage can be more effectively decreased (4% or less in this calculation example) as ratio VC/VT of the distribution width is controlled to, for example, from 1.0 to 2.5, inclusive (1.0≤VC/VT≤2.5). Ratio VC/VT of the distribution width may be greater than 1.0 and less than 2.5.

Control of In-Plane Distribution of Thickness and Impurity Concentration in Silicon Carbide Epitaxial Layer 110

The in-plane distribution of thickness and impurity concentration in silicon carbide epitaxial layer 110 can be controlled by the epitaxial growth conditions of silicon carbide. Hereinafter, a specific example of a method for controlling the in-plane distribution of thickness and impurity concentration will be described.

Epitaxial Growth Apparatus

First, an epitaxial growth apparatus for forming silicon carbide epitaxial layer 110 by epitax al growth will be described. Here, a horizontal planetary (rotary and revolutionary) type epitaxial growth apparatus is used in which a plurality of silicon carbide wafers 301 are horizontally disposed and each silicon carbide wafer 301 is revolved as well as silicon carbide wafer 301 itself is rotated around the center of silicon carbide wafer 301.

Figure 8:
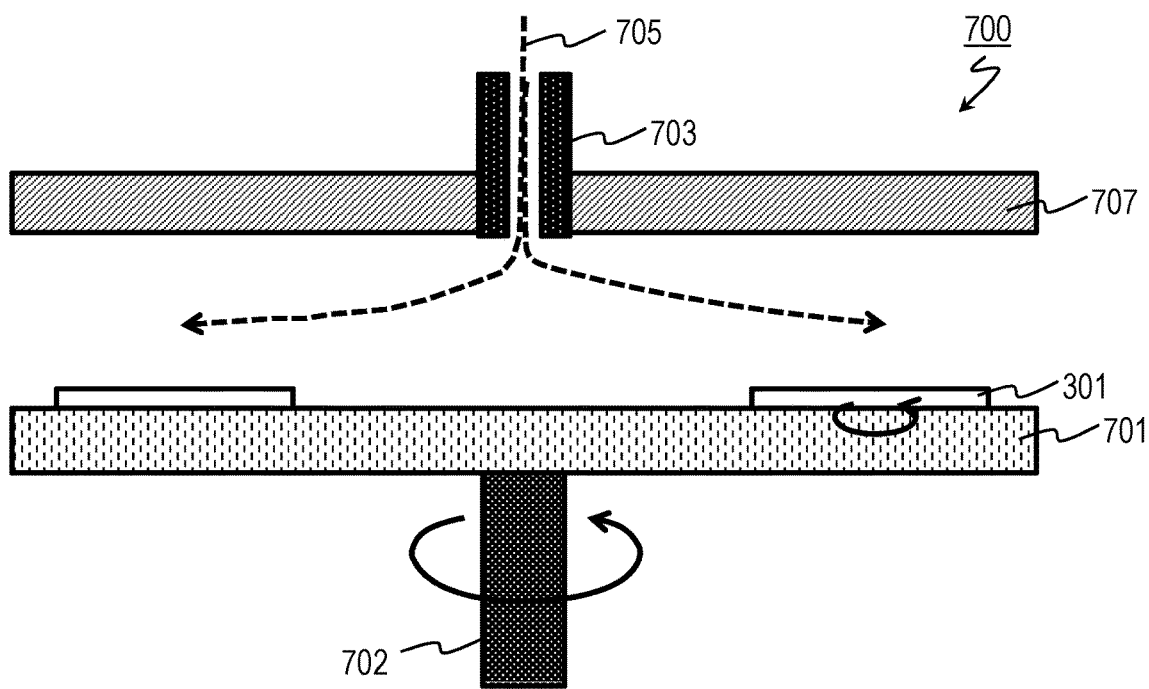
FIG. 8 is a schematic cross-sectional view illustrating an example of an epitaxial growth apparatus.

FIG. 8 is a schematic cross-sectional view illustrating an example of the epitaxial growth apparatus.

Epitaxial growth apparatus 700 includes a reactor (not illustrated), susceptor 701 disposed in the reactor, and gas introduction pipe 703 for supplying gas 705 containing a source gas and a carrier gas into the reactor. Susceptor 701 holds a plurality of silicon carbide wafers 301. Ceiling 707 is disposed above susceptor 701, and gas introduction pipe 703 is provided, for example, at the central portion of ceiling 707. Susceptor 701 has, for example, a disk shape. Shaft 702 for rotating susceptor 701 is provided below susceptor 701.

In this example, silicon carbide wafer 301 is disposed on susceptor 701 with a space around shaft 702. Silicon carbide wafer 301 is placed on a self-rotating satellite (not illustrated) disposed on susceptor 701.

When epitaxial growth apparatus 700 is used, epitaxial growth of SiC can be performed on silicon carbide wafer 301 while revolving each silicon carbide wafer 301 by the rotation of susceptor 701 as well as rotating each silicon carbide wafer 301 by the rotation of the satellite (planetary type).

Gas 705 introduced from gas introduction pipe 703 contains a source gas containing a silicon-based gas (for example, monosilane gas), a carbon-based gas (for example, propane gas), and an impurity gas (for example, nitrogen gas) and a carrier gas (for example, hydrogen gas). Gas 705 is supplied from gas introduction pipe 703 into the reactor and is decomposed and reacts while moving from the central portion of susceptor 701 toward the peripheral edge portion. A silicon carbide epitaxial layer containing nitrogen as an impurity is thus formed on each silicon carbide wafer 301.

Relation Between Epitaxial Growth Condition and In-Plane Distribution of Thickness and Impurity Concentration In a case in which a silicon carbide epitaxial layer is formed using planetary type epitaxial growth apparatus 700 as illustrated in FIG. 8, the in-plane distribution of thickness or impurity concentration in silicon carbide epitaxial layer 110 can change depending on the epitaxial growth conditions. This is considered to be because the position at which the decomposition and reaction of source gas preferentially takes place in the reactor of the epitaxial growth apparatus changes depending on the epitaxial growth conditions and, as a result, the schematic film formation distribution in the plane of susceptor 701 changes. The epitaxial growth conditions include, for example, parameters (hereinafter, "epi control factor") such as carrier gas flow rate, reaction gas supply ratio, growth pressure, and growth temperature.

Hereinafter, the results of investigations on the relation between the epitaxial growth conditions and the in-plane distribution of thickness and impurity concentration conducted by the present inventors will be described.

INVESTIGATION EXAMPLE 1 (RELATION BETWEEN CARRIER GAS FLOW RATE AND THICKNESS DISTRIBUTION)

The film formation distribution in the reactor and the thickness distribution of silicon carbide epitaxial layer 110 in the case of increasing or decreasing the carrier gas flow rate, which is one of the epi control factors, have been investigated, and the results will be described.

Figure 9:
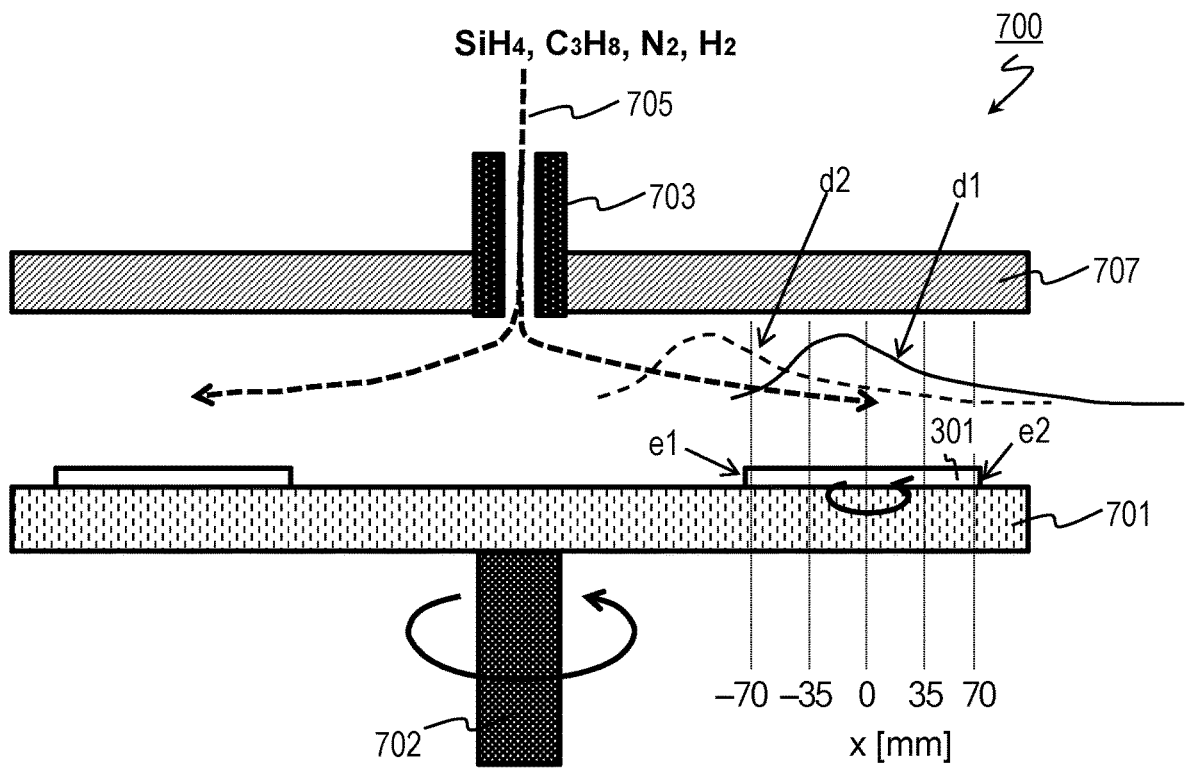
FIG. 9 is a diagram for explaining film formation distribution occurring in a reactor of an epitaxial growth apparatus.

FIG. 9 is a diagram illustrating film formation distributions d1, d2 in the reactor of epitaxial growth apparatus 700. Film formation distribution d1 illustrates the film formation distribution in the reactor in a case in which the carrier gas flow rate is increased and film formation distribution d2 illustrates the film formation distribution in the reactor in a case in which the carrier gas flow rate is decreased.

The supply speed of gas 705 from gas introduction pipe 703 into the reactor decreases when the carrier gas flow rate is decreased, and thus the source gas supplied in the reactor is heated to the decomposition temperature at a position closer to the supply port of gas introduction pipe 703 and reacts and is decomposed. In this example, the peak (the point at which the growth rate is the highest) of film formation distribution d2 is located, for example, on the more upstream side (supply port side of gas introduction pipe 703) than silicon carbide wafer 301 with respect to the flow direction of gas 705. On the other hand, the supply speed of gas 705 increases when the flow rate of the carrier gas is increased, and thus the source gas supplied in the reactor is heated to the decomposition temperature on the more downstream side and reacts and is decomposed. For this reason, the position of peak in film formation distribution d1 moves to the more downstream side (here, the side wall side of the reactor) than the position of peak in film formation distribution d2 with respect to the direction in which gas 705 flows. In this example, the peak of film formation distribution d1 is located, for example, near the central portion of silicon carbide wafer 301.

The present inventors adjusted the carrier gas flow rate so as to attain film formation distributions d1, d2 as described above, formed silicon carbide epitaxial layer 110 on silicon carbide wafer 301 having a diameter of 6 inches (about 150 mm), and measured the in-plane distribution of the thickness of silicon carbide epitaxial layer 110.

Here, the thickness of silicon carbide epitaxial layer 110 was measured at five points along a straight line passing through the center of silicon carbide wafer 301 with an interval from end portion e1 on the upstream side of gas 705 to end portion e2 on the downstream side. The measurement point is represented by distance x(mm) from the center of silicon carbide wafer 301. For distance x, the direction from the center of silicon carbide wafer 301 toward end portion e2 on the downstream side is defined as a plus direction.

Figure 10:
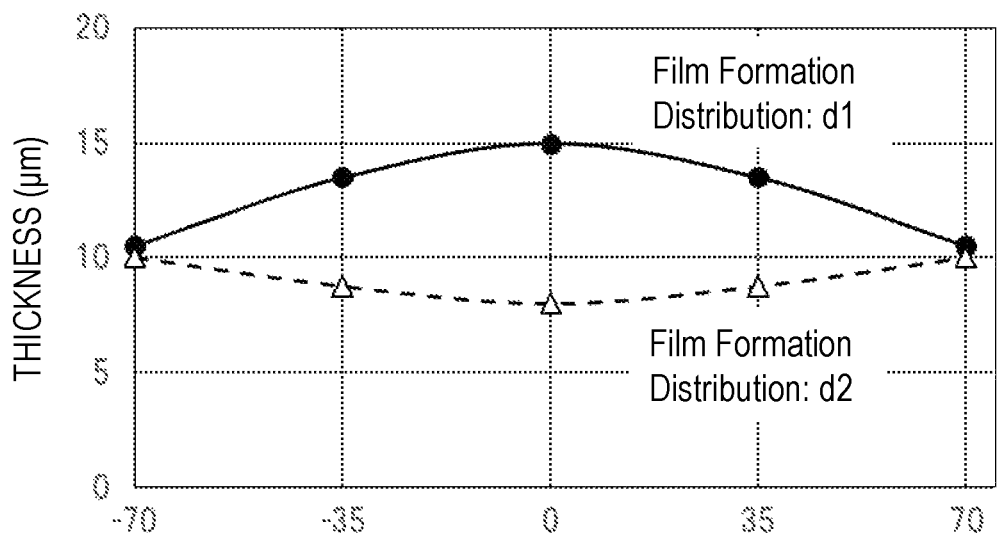
FIG. 10 is a diagram illustrating the relation between film formation distribution and in-plane distribution of the thickness of a silicon carbide epitaxial layer.

The measurement results of thickness at each measurement point are presented in Table 1 and FIG. 10. Moreover, maximum thickness Tmax, minimum thickness Tmin, and average thickness Tave of each in-plane distribution, width VT of the thickness distribution with respect to the average thickness, and the shape of the in-plane distribution were determined from the measurement results. The results are also presented in Table 1.

TABLE 1

| Film formation distribution | Thickness at each measurement point (μm) | | | | | Tmax (μm) | Tmin (μm) | Tave (μm) | Distribution width VT (%) | Shape of distribution |
| --- | --- | --- | --- | --- | --- | --- | --- | --- | --- | --- |
| | x = −70 | x = −35 | x = 0 | x = 35 | x = 70 | | | | | |
| d1 | 10.5 | 13.5 | 15.0 | 13.5 | 10.5 | 15.0 | 10.5 | 12.6 | 17.9 | Convex |
| d2 | 10.0 | 8.75 | 8.0 | 8.75 | 10.0 | 10.0 | 8.0 | 9.1 | 11.0 | Concave |

From the results presented in Table 1 and FIG. 10, it has been confirmed that the shape and width VT of thickness distribution of silicon carbide epitaxial layer 110 can be controlled by adjusting the film formation distribution in the reactor by epi control factors such as the carrier gas flow rate. Moreover, it can be seen that the in-plane distribution of thickness and impurity concentration in silicon carbide epitaxial layer 110 can be concentrically (concavely or convexly) controlled by performing epitaxial growth while rotating silicon carbide wafer 301.

For example, when the epi control factor (film formation distribution d1) is adjusted so that the peak of the film formation distribution is located near the central portion of silicon carbide wafer 301 and epitaxial growth is performed while rotating silicon carbide wafer 301, the in-plane distribution of thickness can be controlled to a convex shape. Alternatively, the epi control factor (film formation distribution d2) may be adjusted so that the peak of the film formation distribution is located at the peripheral edge portion of silicon carbide wafer 301 or on the outer side of silicon carbide wafer 301 and epitaxial growth may be performed while rotating silicon carbide wafer 301. In this case, the in-plane distribution of thickness can be controlled to a concave shape although the in-plane distribution of thickness depends on the shape of film formation distribution as well.

In the above description, an example in which silicon carbide wafer 301 is rotated at the time of epitaxial growth has been described, but silicon carbide wafer 301 may not be rotated. For example, in epitaxial growth apparatus 700, the satellite on which silicon carbide wafer 301 is placed may not be rotated but only susceptor 701 may be rotated (revolutionary type).

Figure 11:
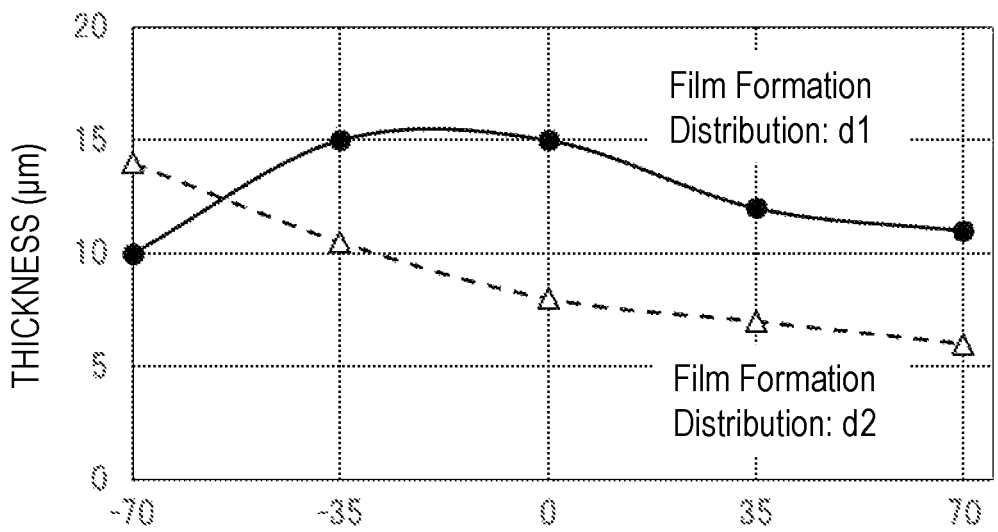
FIG. 11 is a diagram illustrating the relation between film formation distribution and in-plane distribution of the thickness of a silicon carbide epitaxial layer.

The results attained by forming silicon carbide epitaxial layer 110 under the same conditions as the above without rotating silicon carbide wafer 301 and measuring the in-plane distribution of thickness are presented in Table 2 and FIG. 11.

silicon carbide epitaxial layer changed by each epi control factor by the same method as in Investigation Example 1 described above. Here, epitaxial growth was performed while rotating silicon carbide wafer 301.

First, a silicon carbide epitaxial layer was formed under the standard conditions of epitaxial growth apparatus 700 to be used, and the in-plane distribution of the thickness and impurity concentration in the silicon carbide epitaxial layer was attained. The distribution attained is referred to as "reference in-plane distribution".

Subsequently, one epi control factor was varied from the standard value in the plus direction or the minus direction to form a silicon carbide epitaxial layer. The in-plane distribution of the thickness and impurity concentration in the silicon carbide epitaxial layer obtained was measured, and the change with respect to the reference in-plane distribution was examined. The changes in in-plane distribution by other epi control factors were also examined in the same manner.

The results are presented in Table 3. In Table 3, "(−) condition" and "(+) condition" for each epi control factor are values attained by varying the epi control factors in the plus direction or the minus direction with respect to the standard value, respectively. Moreover, the "change in in-plane distribution" is a change with respect to the reference in-plane

TABLE 2

| Growth rate distribution | Thickness at each measurement point (μm) | | | | | Tmax (μm) | Tmin (μm) | Tave (μm) | Distribution width VT (%) | Shape of distribution |
|---|---|---|---|---|---|---|---|---|---|---|
| | x = −70 | x = −35 | x = 0 | x = 35 | x = 70 | | | | | |
| d1 | 10.0 | 15.0 | 15.0 | 12.0 | 11.0 | 15.0 | 10.0 | 12.6 | 19.8 | Convex |
| d2 | 14.0 | 10.5 | 8.0 | 7.0 | 6.0 | 14.0 | 6.0 | 9.1 | 44.0 | |

From the results presented in Table 2 and FIG. 11, it can be seen that the in-plane distribution of thickness can be controlled to a shape close to a convex shape even without performing rotation of silicon carbide wafer 301 when the epi control factor (film formation distribution d1) is adjusted so that the peak of the film formation distribution is located near the central portion of silicon carbide wafer 301. Moreover, it can be seen that the thickness in the plane of silicon carbide wafer 301 decreases from one end portion (end portion e1 on the upstream side in this example) of silicon carbide wafer 301 toward the other end portion (end portion e2 on the downstream side in this example) in a case in which the epi control factor (film formation distribution d2) is adjusted so that the peak of the film formation distribution is located at the peripheral edge portion of silicon carbide wafer 301 or on the outer side of silicon carbide wafer 301 and rotation of silicon carbide wafer 301 is not performed. It is also possible to control the thickness or impurity concentration in silicon carbide epitaxial layer so as to have distribution in which the thickness or impurity concentration increases or decreases from one end portion of silicon carbide wafer 301 toward the other end portion in a case in which rotation of silicon carbide wafer 301 is not performed in this manner.

INVESTIGATION EXAMPLE 2 (RELATION BETWEEN EPI CONTROL FACTOR AND THICKNESS AND IMPURITY CONCENTRATION DISTRIBUTION)

The present inventors investigated how the in-plane distribution of the thickness and impurity concentration in the distribution. It is described as "convex" in a case in which the in-plane distribution changes in a (convex) direction to be lower at the wafer peripheral edge portion than at the central portion with respect to the reference in-plane distribution as a certain epi control factor is switched, it is described as "concave" in a case in which the in-plane distribution changes in a (concave) direction to be higher at the wafer peripheral edge portion than at the central portion, and it is described as "no change" in a case in which there is no change in the relation between the wafer peripheral edge portion and the central portion.

Incidentally, the in-plane distribution of the impurity concentration is greatly affected by the temperature distribution occurring in the plane of silicon carbide wafer 301. This is because the temperature at which the source gas (for example, monosilane gas, propane gas, nitrogen gas) decomposes is different, thus the effective C/Si ratio in the plane of silicon carbide wafer 301 changes depending on the temperature distribution, and the uptake rate of impurity gas into silicon carbide epitaxial layer 110 changes. Examples of factors which affect the temperature distribution of silicon carbide wafer 301 include the warpage of silicon carbide wafer 301 itself and the material and shape of the susceptor holding silicon carbide wafer 301 in addition to the epi control factors. Hence, there is a case in which the direction of change in the in-plane distribution of impurity concentration due to each epi control factor, and the like differ from the results of the present experiment presented in Table 3 depending on the kind of source gas and the apparatus to be used.

TABLE 3

| Epi control factor | Change in thickness in-plane distribution | | Change in impurity concentration in-plane distribution | | Value used in measurement | |
|---|---|---|---|---|---|---|
| | (−)Condition | (+)Condition | (−)Condition | (+)Condition | (−)Condition | (+)Condition |
| Growth temperature | Convex | Concave | Convex | Concave | 1470° C. | 1585° C. |
| Growth pressure | Little change (Concave) | Little change (Convex) | Convex | Concave | 100 hPa | 200 hPa |
| $H_2$ gas flow rate | Concave | Convex | Little change (Convex) | Little change (Concave) | 130 slm | 180 slm |
| C/Si ratio | No change | No change | Convex | Concave | 1.1 | 1.4 |

The slm is a unit of the flow rate. 1 slm indicates the amount of a gas which is in a standard state (0° C., 1 atmosphere) and flows by 1 liter for one minute.

(1) Growth Temperature (Temperature of Silicon Carbide Wafer 301 During Epitaxial Growth)

When the growth temperature is set to be high (for example, more than 1500° C. and less than or equal to 1600° C., 1585° C. here), the in-plane distributions of thickness and impurity concentration in silicon carbide epitaxial layer 110 both (concavely) change so as to be smaller at the central portion of silicon carbide wafer 301 than at the peripheral edge portion. On the other hand, when the growth temperature is set to be low (for example, from 1400° C. to 1500° C., inclusive, 1470° C. here), the in-plane distributions of thickness and impurity concentration in silicon carbide epitaxial layer 110 both (convexly) change so as to be greater at the central portion of silicon carbide wafer 301 than at the peripheral edge portion.

It is considered that a change in the in-plane distribution of thickness can occur as the position at which the decomposition and reaction of source gas preferentially takes place in the reactor of the epitaxial growth apparatus changes (that is the film formation distribution changes) depending on the in-plane distribution of growth temperature. Specifically, when the growth temperature is lowered, the decomposition and reaction of source gas is delayed, and the peak of film formation distribution shifts to the downstream side with respect to the direction in which gas 705 flows. By this, film formation distribution having a peak near the central portion of the wafer is attained, for example, as film formation distribution d1 illustrated in FIG. 9. The in-plane distribution of thickness of silicon carbide epitaxial layer 110 can be convexly changed by adjusting such film formation distribution and performing epitaxial growth while rotating silicon carbide wafer 301.

On the other hand, when the growth temperature is set to be high, the decomposition and reaction of source gas is accelerated, and thus the peak of film formation distribution shifts to the upstream side. By this, film formation distribution having a peak on the further upstream side than end portion e1 on the upstream side of the wafer is attained, for example, as film formation distribution d2 illustrated in FIG. 9. The in-plane distribution of thickness of silicon carbide epitaxial layer 110 can be concavely changed by adjusting such film formation distribution and performing epitaxial growth while rotating silicon carbide wafer 301.

The temperature at which each source gas (for example, monosilane gas, propane gas, nitrogen gas) decomposes is different, and thus the relation between the in-plane distribution of impurity concentration and the growth temperature (substrate temperature) cannot be unconditionally explained but is considered as follows. When the temperature distribution in the plane of silicon carbide wafer 301 changes by different growth temperatures (and other factors), the effective C/Si ratio changes in the plane of silicon carbide wafer 301, and thus the in-plane distribution of the uptake rate of impurity gas into silicon carbide epitaxial layer 110 changes. As a result, it is considered that the in-plane distribution of the impurity concentration can change. In experimental results of this time, the in-plane distribution of the impurity concentration convexly changed when the growth temperature was low and concavely changed when the growth temperature was high.

(2) Growth Pressure (Pressure in Chamber During Epitaxial Growth)

When the growth pressure is set to be high (here, 200 hPa), the impurity concentration in silicon carbide epitaxial layer 110 (concavely) changes so as to be lower at the central portion of silicon carbide wafer 301 than at the peripheral edge portion. On the other hand, when the growth pressure is set to be low (here, 100 hPa), the impurity concentration in silicon carbide epitaxial layer 110 (convexly) changes so as to be higher at the central portion of silicon carbide wafer 301 than at the peripheral edge portion. This is because the pressure at which each source gas (for example, monosilane gas, propane gas, nitrogen gas) decomposes is different, thus the effective C/Si ratio changes in the plane when the growth pressure is varied, and the in-plane distribution of uptake amount of impurity gas changes.

On the other hand, the in-plane distribution of thickness does not much change even when the growth pressure is changed. In the results of present experiment, the in-plane distribution of thickness convexly changed when the growth pressure was high and the in-plane distribution of thickness concavely changed when the growth pressure was low although the amount of change was small. This is considered to be because the film formation distribution in the reactor of epitaxial growth apparatus 700 does not greatly change in the range of growth pressure of from 100 hPa to 200 hPa.

(3) Carrier Gas Flow Rate (Carrier Gas Flow Rate in Chamber During Epitaxial Growth)

When the carrier gas flow rate is increased (here, 180 slm), the thickness of silicon carbide epitaxial layer 110 (convexly) changes so as to be thicker at the central portion of silicon carbide wafer 301 than at the peripheral edge portion. On the other hand, when the carrier gas flow rate is decreased (here, 130 slm), the thicknesses of silicon carbide epitaxial layer 110 (concavely) changes so as to be thinner at the central portion of silicon carbide wafer 301 than at the peripheral edge portion. The mechanism of this is as described above with reference to FIGS. 9 to 11.

On the other hand, the in-plane distribution of impurity concentration does not much change even when the carrier gas flow rate is changed. The in-plane distribution of impurity concentration can concavely change when the carrier gas flow rate is increased and the in-plane distribution of impurity concentration can convexly change when the carrier gas flow rate is decreased although the amount of change is small. This is considered to be because the effective C/Si ratio does not change even when the carrier gas flow rate is changed and the in-plane distribution of the uptake amount of nitrogen gas, which is an impurity gas, does not change.

(4) C/Si Ratio in Source Gas

When the C/Si ratio is set to be high (here, 1.4), the impurity concentration in silicon carbide epitaxial layer 110 (concavely) changes so as to be lower at the central portion of silicon carbide wafer 301 than at the peripheral edge portion. On the other hand, when the C/Si ratio is set to be low (here, 1.1), the impurity concentration in silicon carbide epitaxial layer 110 (convexly) changes so as to be higher at the central portion of silicon carbide wafer 301 than at the peripheral edge portion. This is considered to be because the effective C/Si ratio in the plane of silicon carbide wafer 301 changes by the balance between the amount of C (carbon) supplied (for example, the amount of propane gas supplied) and the amount of C supplied from the parts (usually carbon-based parts) in the reactor, and the in-plane distribution of the uptake amount of impurity gas (nitrogen gas) changes.

On the other hand, the in-plane distribution of thickness does not change even when the C/Si ratio is changed. In a case in which the C/Si ratio is 1 or more, C (carbon) is in an excessively supplied state and the supply rate is limited by Si (silicon), and thus the film formation distribution does not depend on the amount of C (for example, the amount of propane gas supplied). It is considered that the in-plane distribution of thickness does not change since the film formation distribution does not change.

Incidentally, the epi control factors are not limited to the factors presented in Table 3. In addition, a plurality of epi control factors affect each other, and thus the shape of in-plane distribution is not determined by the value of one epi control factor. For example, as the effective C/Si ratio in the plane of wafer changes depending on the balance between the temperature distribution in the plane of wafer, the source gas flow rate, the C/Si ratio in the source gas, and the like, it is considered that the in-plane distribution of thickness and impurity concentration can concavely and convexly change. Furthermore, these in-plane distributions can also change depending on the structure (presence or absence of rotation of wafer, positional relationship between the supply port of source gas and the wafer, the shape and material of parts in the reactor, and the like) of the epitaxial growth apparatus used.

Method for Adjusting Epi Control Factor

In the present exemplary embodiment, predetermined in-plane distribution of the thickness or impurity concentration in silicon carbide epitaxial layer 110 is caused by adjusting epi control factors. Hereinafter, the method for adjusting an epi control factor will be described.

Step A

First, an epitaxial layer is formed on a silicon carbide wafer under the standard epitaxial growth conditions of the apparatus using epitaxial growth apparatus 700 to be used. By this, thickness distribution and impurity concentration distribution (reference in-plane distribution) in the plane of the silicon carbide wafer are attained.

Step B

Subsequently, an epi control factor is adjusted so that one of the thickness distribution or the impurity concentration distribution has a desired shape (for example, a convex shape or a concave shape) and the width of the distribution is in a predetermined range.

Step C

Subsequently, another epi control factor is adjusted so that the other of the thickness distribution or the impurity concentration distribution has a positive correlation with the one in-plane distribution controlled in the step (B) and the width of the distribution is in a predetermined range. At this time, it is preferable to adjust another epi control factor that easily affects only the in-plane distribution to be controlled. For example, it is preferable that the carrier gas flow rate is adjusted in the case of controlling the thickness distribution in the present step and the C/Si ratio in the source gas, the growth pressure, or both of these are adjusted in the case of controlling the impurity concentration distribution in the present step.

Step D

Finally, the epi control factor or other epitaxial growth conditions are finely adjusted so that width VT of the thickness distribution and width VC of the impurity concentration distribution are in predetermined ranges, respectively.

EXAMPLES AND COMPARATIVE EXAMPLES

Silicon carbide epitaxial wafers of Examples and Comparative Examples were fabricated and in-plane variation in silicon carbide epitaxial layer 110 was evaluated, and thus the methods and results will be described.

As Examples, using the method for adjusting epi control factor, a silicon carbide epitaxial wafer was fabricated by forming silicon carbide epitaxial layer 110 on silicon carbide wafer 301 having a diameter of 6 inches (about 150 mm). The designed values of thickness and impurity concentration in silicon carbide epitaxial layer 110 were 9 μm and $1 \times 10^{16}$/ $cm^3$, respectively. In addition, when epitaxially growth of silicon carbide epitaxial layer 110 was performed, the growth temperature was set to 1530° C., the growth pressure was set to 200 hPa, the carrier gas ($H_2$ gas) flow rate was set to 130 slm, and the ratio of source gas supplied (C/Si ratio) was set to 1.30.

In addition, as Comparative Example, a silicon carbide epitaxial wafer of Comparative Example was fabricated by the same method as in Examples except that the carrier gas ($H_2$ gas) flow rate was set to 180 slm and the ratio of source gas supplied (C/Si ratio) was set to 1.20.

Figure 12:
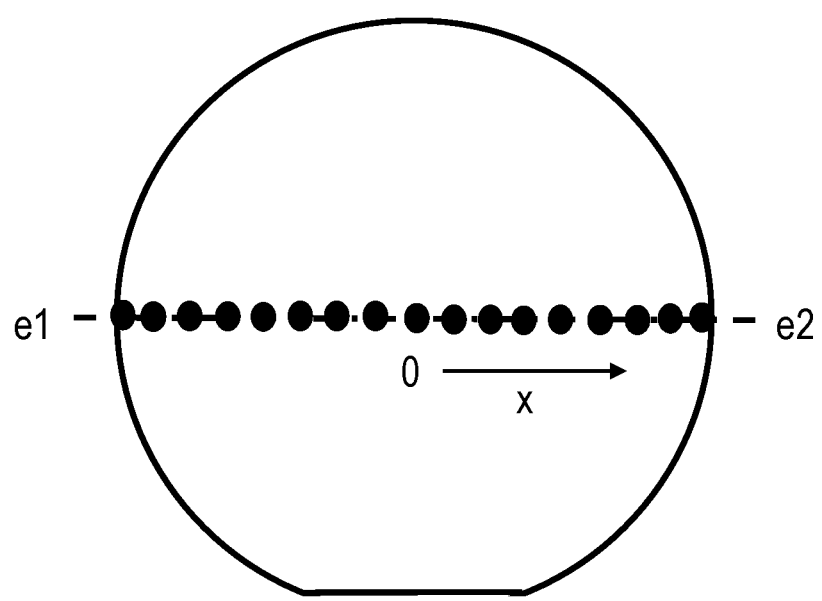
FIG. 12 is a plan view illustrating the measurement position of in-plane distribution in a silicon carbide epitaxial wafer.

Subsequently, in Examples and Comparative Examples, the thickness distribution and impurity concentration distribution in silicon carbide epitaxial layer 110 in the plane of silicon carbide wafer 301 were measured. Here, the thickness and impurity concentration were measured at 17 points from one end portion e1 to the other end portion e2 along a straight line passing through the center of silicon carbide wafer 301 as illustrated in FIG. 12, and the distributions were determined.

Figure 13A:
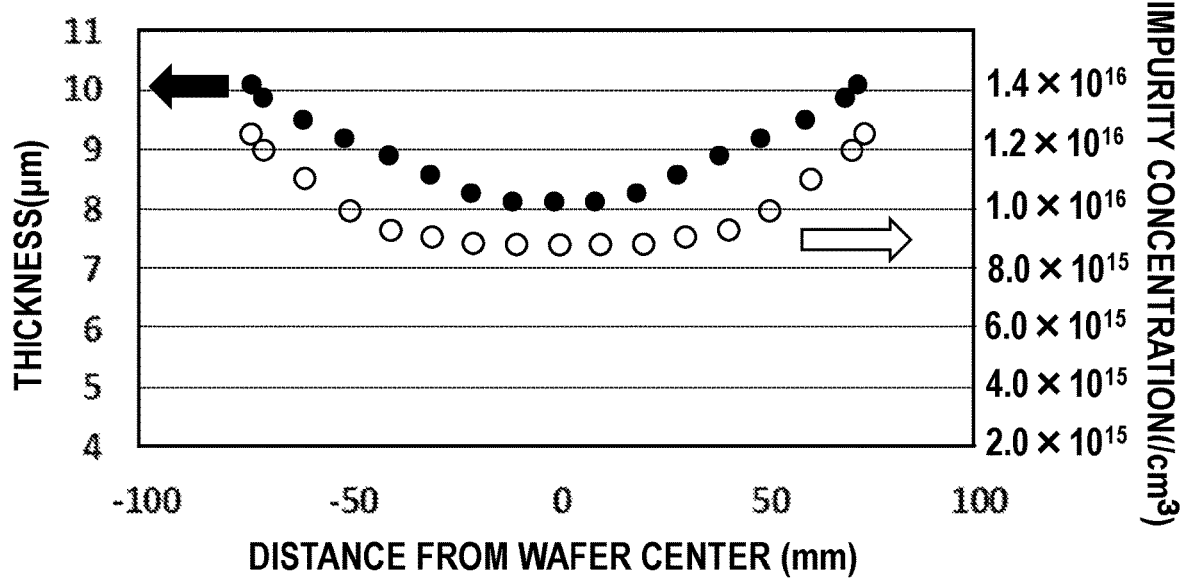
FIG. 13A is a diagram illustrating in-plane distribution of thickness and impurity concentration in a silicon carbide epitaxial layer in Examples.
Figure 13B:
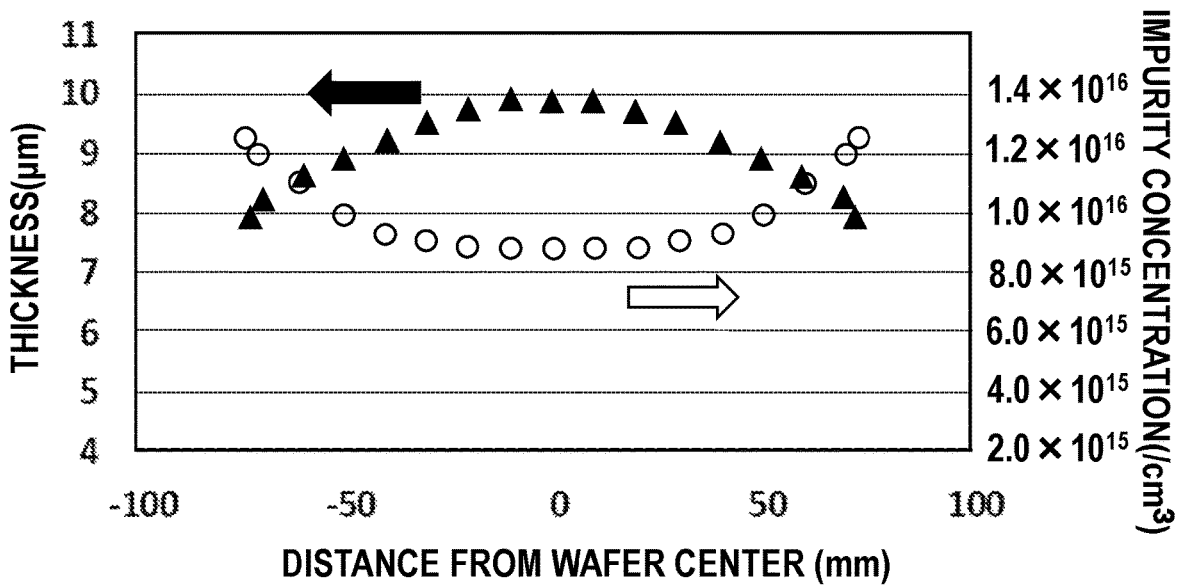
FIG. 13B is a diagram illustrating in-plane distribution of thickness and impurity concentration in a silicon carbide epitaxial layer in Comparative Examples.

FIG. 13A is a diagram illustrating the in-plane distribution of thickness and impurity concentration in silicon carbide epitaxial layer 110 in Examples. Incidentally, in FIG. 13A, "●" denotes the thickness of silicon carbide epitaxial layer 110 at a predetermined distance from the center of silicon carbide wafer 301. Incidentally, in FIG. 13A, "○" denotes the impurity concentration in silicon carbide epitaxial layer 110 at a predetermined distance from the center of silicon carbide wafer 301. FIG. 13B is a diagram illustrating the in-plane distribution of thickness and impurity concentration in silicon carbide epitaxial layer 110 in Comparative Examples. Incidentally, in FIG. 13B, "▲" denotes the thickness of silicon carbide epitaxial layer 110 at a predetermined distance from the center of silicon carbide wafer 301. Incidentally, in FIG. 13A, "○" denotes the impurity concentration in silicon carbide epitaxial layer 110 at a predetermined distance from the center of silicon carbide wafer 301.

As illustrated in FIG. 13A, in the silicon carbide epitaxial wafer of Examples, the thickness and impurity concentration in silicon carbide epitaxial layer 110 both have a concave in-plane distribution. In other words, these in-plane distributions have a positive correlation. On the other hand, as illustrated in FIG. 13B, in the silicon carbide epitaxial wafer of Comparative Examples, the in-plane distribution of thickness of silicon carbide epitaxial layer 110 is convex and the in-plane distribution of impurity concentration is concave, and these in-plane distributions have a negative correlation.

Moreover, in both Examples and Comparative Examples, width VT of the thickness distribution of silicon carbide epitaxial layer 110 is 10% and width VC of the impurity concentration distribution is 20%.

Subsequently, variation widths VB, VD of breakdown voltage and drift resistance in the silicon carbide semiconductor devices were determined when semiconductor devices (SiC-MISFET) were formed using the silicon carbide epitaxial wafers of Examples and Comparative Examples. Here, maximum values Bmax, Dmax, minimum values Bmin, Dmin, and average values Bave, Dave of the breakdown voltage and drift resistance in the plane of silicon carbide wafers were calculated, respectively based on the measurement results illustrated in FIGS. 13A and 13B and Equations (1) and (2) described above. Moreover, difference ΔB (=Bmax−Bmin) between the maximum value and the minimum value of the breakdown voltage, variation width VB (%) (=(ΔB/2)/Bave×100) of the breakdown voltage, difference ΔD=(Dmax−Dmin) between the maximum value and the minimum value of the drift resistance, and variation width VD (%) (=(ΔD/2)/Dave×100) of the drift resistance were determined, respectively.

Figure 14A:
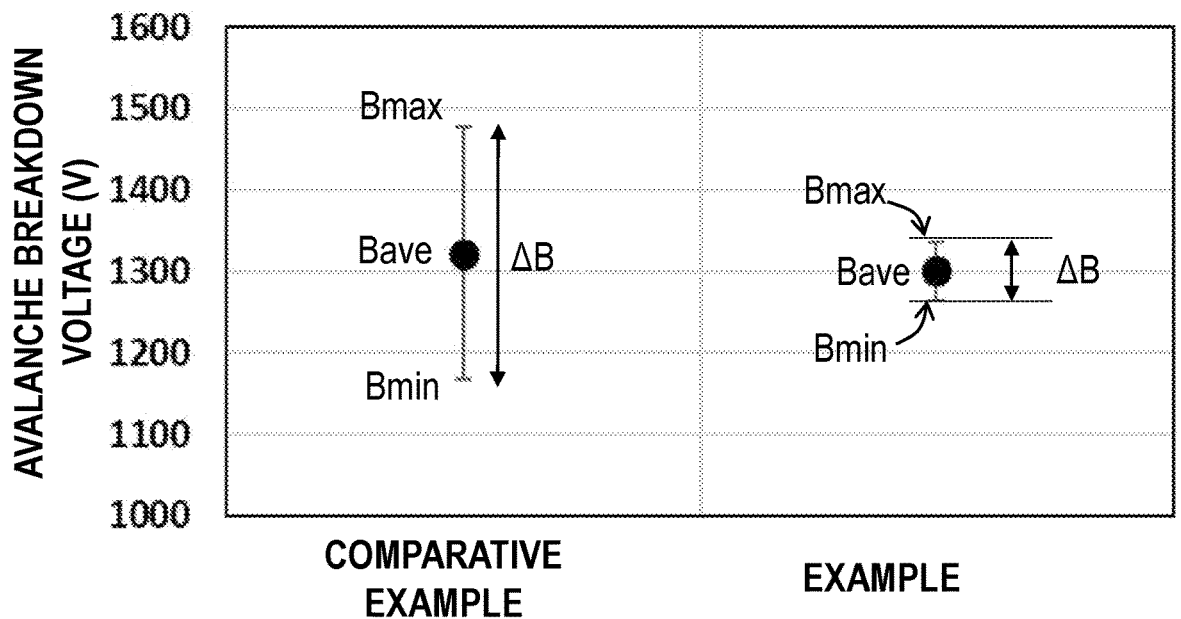
FIG. 14A is a diagram illustrating a difference between a maximum value and a minimum value of breakdown voltage in Examples and Comparative Examples.
Figure 14B:
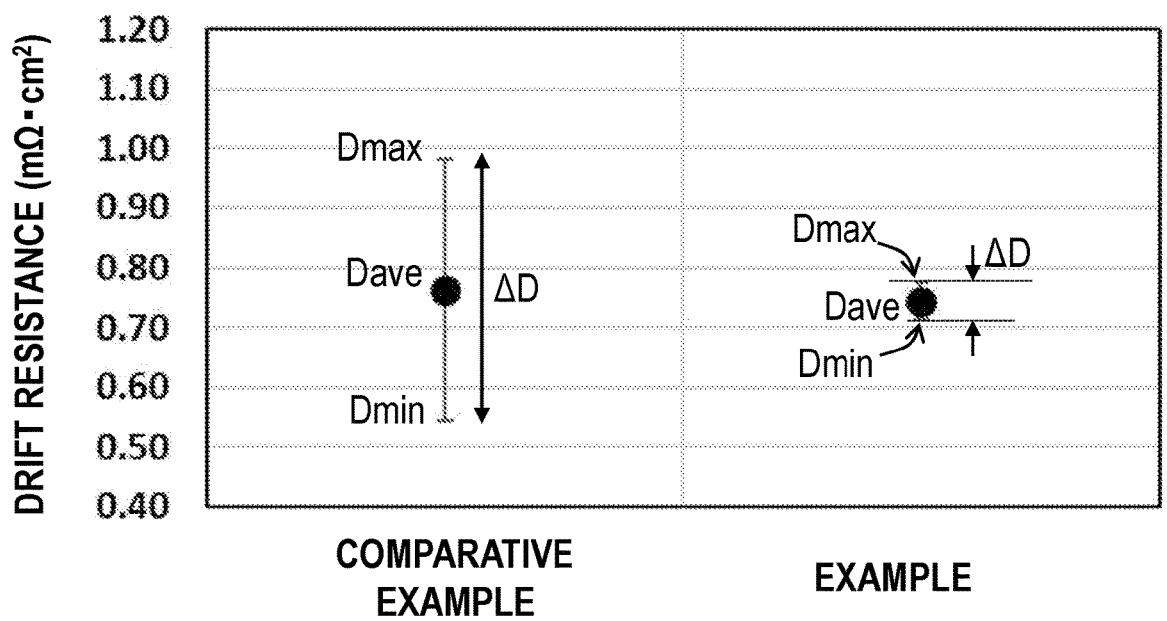
FIG. 14B is a diagram illustrating a difference between a maximum value and a minimum value of drift resistance in Examples and Comparative Examples.

Average values Bave, Dave and variation widths VB, VD of the breakdown voltage and drift resistance are presented in Table 4. Moreover, difference ΔB between the maximum value and minimum value of breakdown voltage in Examples and Comparative Examples are illustrated in FIG. 14A. Difference ΔD between the maximum value and minimum value of drift resistance in Examples and Comparative Examples are illustrated in FIG. 14B.

TABLE 4

|  | Drift resistance | | Avalanche breakdown voltage | |
| --- | --- | --- | --- | --- |
|  | Average value Dave (mΩ · cm$^2$) | Variation width VD (%) | Average value Bave (V) | Variation width VB (%) |
| Comparative Example | 0.76 | 29 | 1323 | 12 |
| Example | 0.75 | 4 | 1301 | 3 |

In Comparative Examples, variation widths VB, VD of breakdown voltage and drift resistance of the semiconductor device both exceed 10%. This is considered to be because the impurity concentration distribution and thickness distribution of silicon carbide epitaxial layer 110 have a negative correlation, the fluctuation portions (absolute value) of breakdown voltage and drift resistance due to the thickness distribution and fluctuation portions (absolute value) of breakdown voltage and drift resistance due to the impurity concentration distribution are added to each other, and as a result, differences ΔB, ΔD between the maximum value and the minimum value and variation widths VB, VD in breakdown voltage and drift resistance are increased.

On the other hand, differences ΔB, ΔD and variation widths VB, VD in breakdown voltage and drift resistance are decreased in Examples as compared with those in Comparative Examples. Variation widths VB, VD in Examples are both less than or equal to 10%. This is considered to be because the impurity concentration distribution and thickness distribution of silicon carbide epitaxial layer 110 have a positive correlation and the fluctuation portions of breakdown voltage and drift resistance due to the thickness distribution and the fluctuation portions of breakdown voltage and drift resistance due to the impurity concentration distribution are compensated by each other.

Method for Manufacturing Silicon Carbide Semiconductor Device 200

Next, a method for manufacturing silicon carbide semiconductor device 200 according to the present exemplary embodiment will be described with reference to the accompanying drawings.

Figure 15A:
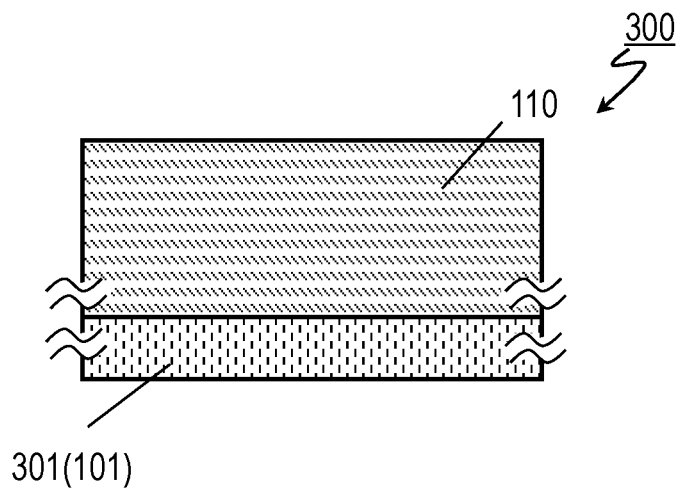
FIG. 15A is a cross-sectional view for explaining a method for manufacturing a silicon carbide semiconductor device.

FIGS. 15A to 15F are cross-sectional views for explaining the method for manufacturing silicon carbide semiconductor device 200. FIG. 15A illustrates silicon carbide epitaxial wafer 300. FIGS. 15B to 15F illustrate one unit cell-formed region Ru in silicon carbide epitaxial wafer 300.

As illustrated in FIG. 15A, first conductivity type (n-type) silicon carbide epitaxial layer 110 is first epitaxially grown on the principal surface of silicon carbide wafer 301 to obtain silicon carbide epitaxial wafer 300.

As silicon carbide wafer 301, for example, an off cut substrate in which a 4H—SiC (0001) plane is inclined by four degrees in a [11-20] direction is used. The diameter of silicon carbide wafer 301 is, for example, 6 inches (about 150 mm). Silicon carbide wafer 301 is n-type, and the impurity concentration in silicon carbide wafer 301 is, for example, about from $5\times10^{18}$ cm$^{-3}$ to $1\times10^{19}$ cm$^{-3}$.

For the formation of silicon carbide epitaxial layer 110, for example, the planetary (rotary and revolutionary) type or revolutionary type epitaxial growth apparatus described above with reference to FIG. 8 is used. Moreover, as described above, the epitaxial growth conditions (epi control factors) are set so that silicon carbide epitaxial layer 110 can have desired thickness distribution and desired impurity concentration distribution.

First, silicon carbide wafer 301 is placed in the reactor, and the temperature of silicon carbide wafer 301 is raised before epitaxial growth. In this heating process, source gas is not supplied into the reactor and silicon carbide wafer 301 is heated in an atmosphere containing at least hydrogen. At the time point at which the temperature (wafer temperature) of silicon carbide wafer 301 reaches a predetermined growth temperature (here, 1600° C.), supply of a mixed gas of the source gas and the carrier gas is started. The source gas contains, for example, monosilane gas, propane gas, and nitrogen gas which is an impurity gas. In this manner, silicon carbide epitaxial layer 110 is formed on the principal surface of silicon carbide wafer 301, for example, in a thickness of about from 5 µm to 100 µm (for example, 9 µm). The n-type impurity concentration in silicon carbide epitaxial layer 110 is set to be lower than the n-type impurity concentration in silicon carbide wafer 301 and is, for example, from $1\times10^{14}$ $cm^{-3}$ to $1\times10^{17}$ $cm^{-3}$, inclusive (for example, $1\times10^{16}$ $cm^{-3}$). In addition, although it is not illustrated, a buffer layer having a thickness of about from 0.1 µm to 5 µm, inclusive (for example, 0.5 µm) and a concentration of from $1\times10^{17}$ $cm^{-3}$ to $1\times10^{19}$ $cm^{-3}$, inclusive (for example, $1\times10^{18}$ $cm^{-3}$) may be formed between silicon carbide epitaxial layer 110 and silicon carbide wafer 301.

Figure 15B:
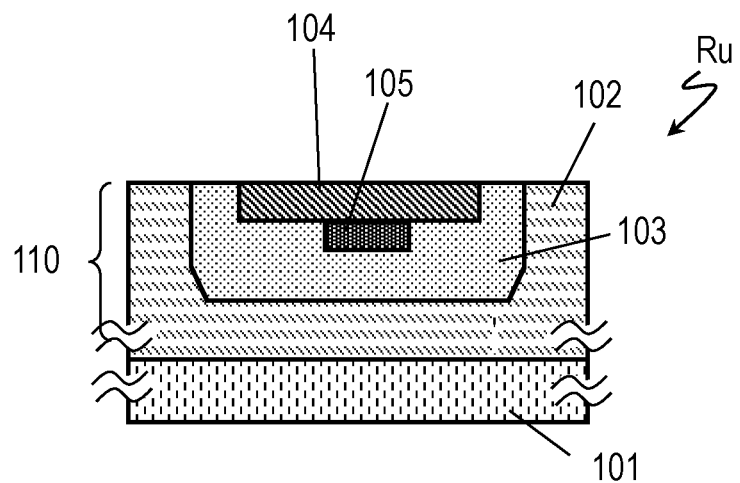
FIG. 15B is a cross-sectional view for explaining a method for manufacturing a silicon carbide semiconductor device.

Next, as illustrated in FIG. 15B, in unit cell-formed region Ru, p-type or n-type impurity ions are implanted into a selected region of silicon carbide epitaxial layer 110 to form body region 103, source region 104, and contact region 105.

Specifically, for example, a mask composed of $SiO_2$ (not illustrated) is formed on silicon carbide epitaxial layer 110, and then p-type impurity ions (for example, Al ions or B ions) are implanted into a region in which the mask is not formed to form body region 103. The width of body region 103 is, for example, 5 µm to 10 µm. The concentration of p-type impurity in body region 103 is, for example, from $1\times10^{17}$ $cm^{-3}$ to $1\times10^{20}$ $cm^{-3}$, inclusive.

Furthermore, n-type impurity ions (for example, nitrogen ions) are further implanted into contact region 105 to form source region 104. The concentration of n-type impurity in source region 104 is, for example, from $1\times10^{18}$ $cm^{-3}$ to $1\times10^{21}$ $cm^{-3}$, inclusive.

Moreover, p-type impurity ions are implanted into body region 103 to form contact region 105. The concentration of p-type impurity in contact region 105 is, for example, from $1\times10^{19}$ $cm^{-3}$ to $1\times10^{21}$ $cm^{-3}$, inclusive.

After the ions are implanted, the mask is removed to perform annealing for activation. For example, the annealing for activation is performed in an inert atmosphere at a temperature of about 1700° C. for about 30 minutes.

Figure 15C:
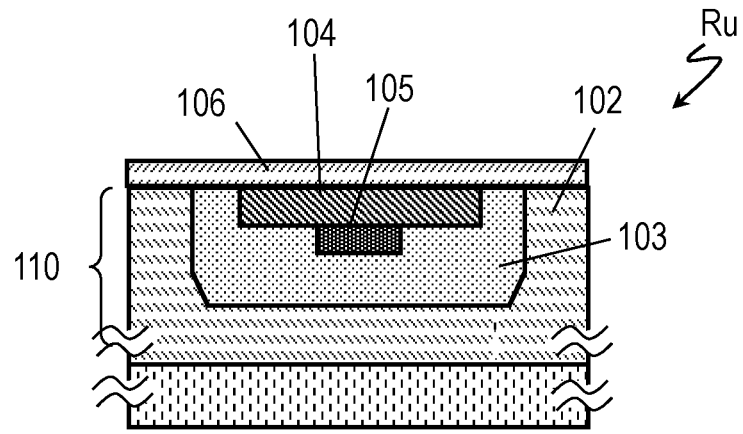
FIG. 15C is a cross-sectional view for explaining a method for manufacturing a silicon carbide semiconductor device.

Next, as illustrated in FIG. 15C, channel layer 106 may be formed on the entire surface of silicon carbide epitaxial layer 110 including body region 103, source region 104, and contact region 105 by epitaxial growth. In the present exemplary embodiment, channel layer 106 is formed by supplying nitrogen gas as an impurity gas. The average concentration in channel layer 106 is, for example, about from $1\times10^{18}$ $cm^{-3}$ to $1\times10^{19}$ $cm^{-3}$, inclusive. The average thickness of channel layer 106 is, for example, from 20 nm to 100 nm, inclusive. Incidentally, channel layer 106 may not be formed.

Figure 15D:
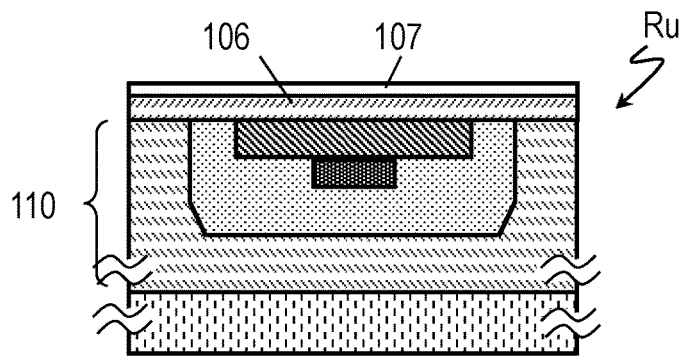
FIG. 15D is a cross-sectional view for explaining a method for manufacturing a silicon carbide semiconductor device.

Next, as illustrated in FIG. 15D, for example, the surface portion of channel layer 106 is thermally oxidized to form gate insulating film 107 on the surface of silicon carbide epitaxial layer 110. Gate insulating film 107 may be an oxide film, an oxynitride film, or a laminated film of the oxide film and the oxynitride film. Here, as gate insulating film 107, for example, a thermal oxide ($SiO_2$) film is formed by thermally oxidizing the surface of silicon carbide epitaxial layer 110 at a temperature of from 1100° C. to 1400° C. The thickness of gate insulating film 107 is, for example, from 40 nm to 80 nm, inclusive. Incidentally, a $SiO_2$ film may be formed on silicon carbide epitaxial layer 110 by a CVD method instead of the thermal oxide film.

Figure 15E:
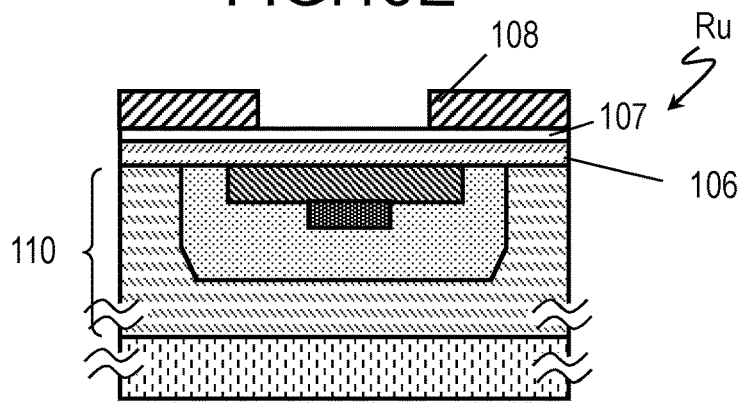
FIG. 15E is a cross-sectional view for explaining a method for manufacturing a silicon carbide semiconductor device.

Subsequently, gate electrode 108 is formed on gate insulating film 107 as illustrated in FIG. 15E. Gate electrode 108 can be formed, for example, by depositing phosphorus-doped polysilicon (poly-Si film) on gate insulating film 107 using a low pressure chemical vapor deposition (LPCVD) apparatus.

Figure 15F:
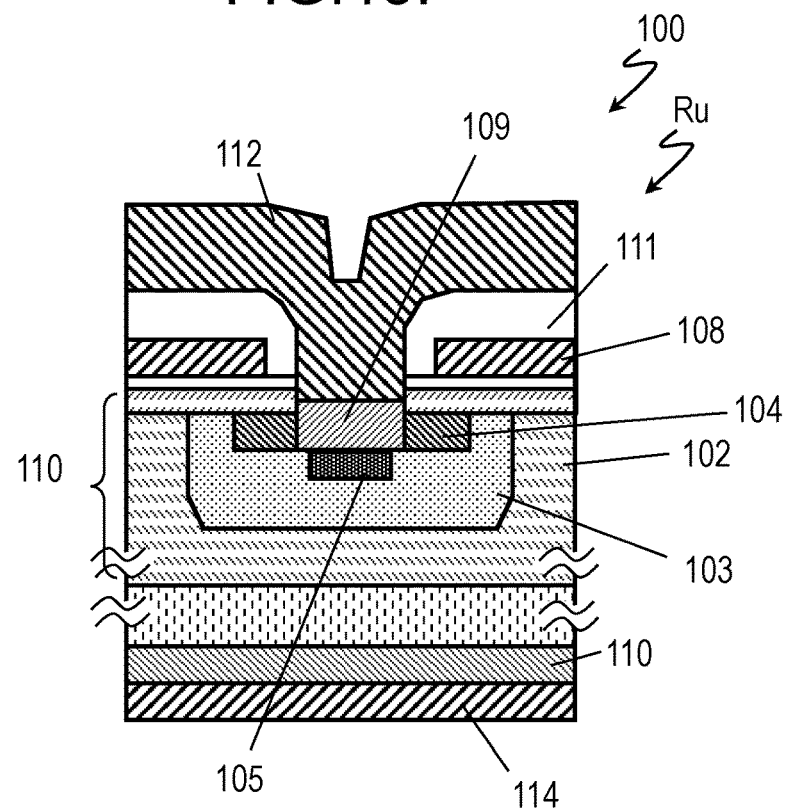
FIG. 15F is a cross-sectional view for explaining a method for manufacturing a silicon carbide semiconductor device.

Subsequently, source electrode 109 and drain electrode 114 are formed as illustrated in FIG. 15F.

Interlayer insulating layer 111 is first deposited so as to cover gate electrode 108, for example, by a CVD method. Interlayer insulating layer 111 may be composed of $SiO_2$. After that, an opening for source electrode is formed on interlayer insulating layer 111. Subsequently, source electrode 109 is formed in the opening of interlayer insulating layer 111. Here, for example, a nickel film having a thickness of about from 50 nm to 100 nm is first formed in the opening, and then a heat treatment is performed in an inert atmosphere at a temperature of 950° C. for 5 minutes so that nickel reacts with the silicon carbide surface. Source electrode 109 composed of nickel silicide is thus formed. Source electrode 109 forms ohmic contact with a part of source region 104 and contact region 105. Moreover, drain electrode 114 is formed on a back surface of silicon carbide substrate 101. For example, titanium having a thickness of about 150 nm is deposited on the back surface of silicon carbide substrate 101 and a similar heat treatment is performed so that titanium reacts with the silicon carbide surface. Drain electrode 114 composed of titanium silicide is thus formed. Drain electrode 114 forms ohmic contact with silicon carbide substrate 101. After that, source wire 112 to be in contact with source electrode 109 in the opening is formed on interlayer insulating layer 111 and in the opening of interlayer insulating layer 111.

Through the steps described above, an device structure including the plurality of unit cells 100 is formed in each device region Rc of silicon carbide epitaxial wafer 300. After that, silicon carbide epitaxial wafer 300 is cut every device (chip) although it is not illustrated. A plurality of silicon carbide semiconductor devices (MISFETs) 200 are thus obtained.

A silicon carbide semiconductor device according to the present exemplary embodiment is not limited to a planar-structured vertical MISFET but may be a trench-structured vertical MISFET. Alternatively, the silicon carbide semiconductor device may be a horizontal MISFET in which a source electrode and a drain electrode are disposed on the principal surface of a silicon carbide wafer. Alternatively, the silicon carbide semiconductor device may be a junction field effect transistor (JFET) and the like. Furthermore, an insulated gate bipolar transistor (IGBT) can be manufactured using a silicon carbide wafer having a conductivity type different from that of silicon carbide epitaxial layer 110.

The semiconductor device in the present exemplary embodiment may be a diode such as a Schottky Barrier Diode (SBD), a junction barrier diode (JBD), or a PN diode (PND). The diode includes a semiconductor substrate, a first conductivity type semiconductor epitaxial layer disposed on the principal surface of the semiconductor substrate, a first electrode that is disposed on the semiconductor epitaxial layer and is in contact with the semiconductor epitaxial layer, and a second electrode that is disposed on the surface (back surface) on the side opposite to the principal surface of the semiconductor substrate and is in contact with the semiconductor substrate. In the diode, the proportion of the drift resistance component in the on-resistance is higher than that in the transistor. For this reason, a more remarkable effect is attained when the present exemplary embodiment is applied to a diode or a semiconductor epitaxial wafer on which a diode is formed.

Figure 16:
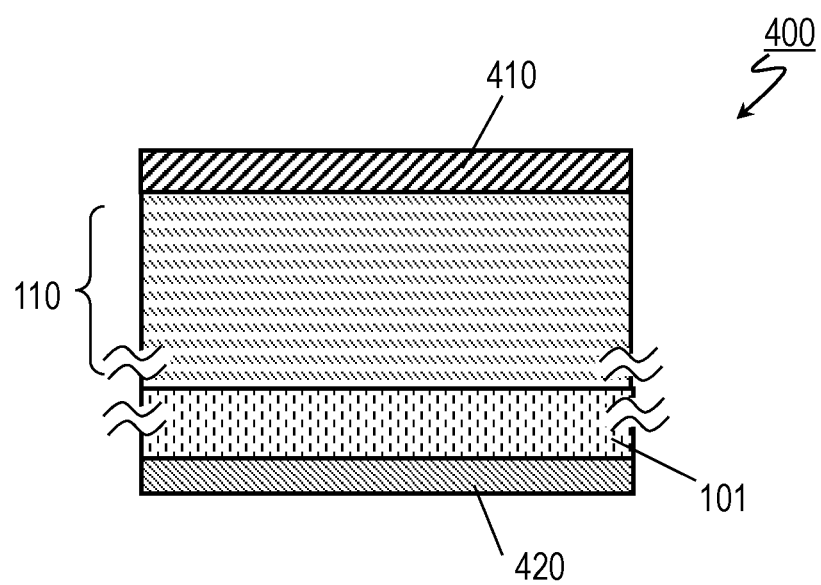
FIG. 16 is a cross-sectional view illustrating another example of a silicon carbide semiconductor device.

FIG. 16 is a schematic cross-sectional view illustrating a Schottky diode which is an example of the semiconductor device in the present exemplary embodiment. Schottky diode 400 includes first conductivity type silicon carbide substrate 101, silicon carbide epitaxial layer 110 disposed on the principal surface of silicon carbide substrate 101, first electrode 410 disposed on silicon carbide epitaxial layer 110, and second electrode 420 formed on the back surface of silicon carbide substrate 101. Silicon carbide substrate 101 is a part of silicon carbide wafer 301. Silicon carbide epitaxial layer 110 includes a first conductivity type drift layer. First electrode 410 forms Schottky junction with silicon carbide epitaxial layer 110. Second electrode 420 forms ohmic junction with silicon carbide substrate 101. Also in Schottky diode 400, the thickness distribution of silicon carbide epitaxial layer 110 and the concentration distribution of impurity in silicon carbide epitaxial layer 110 have a positive correlation in a plane parallel to silicon carbide substrate 101.

Furthermore, the present exemplary embodiment can also be applied to a semiconductor epitaxial wafer and a semiconductor device in which another wide bandgap semiconductor such as gallium nitride (GaN), gallium oxide ($Ga_2O_3$), and diamond are used in addition to silicon carbide. Moreover, the present exemplary embodiment can also be applied to a semiconductor epitaxial wafer and a semiconductor device in which silicon is used.

The technology disclosed in the present specification is useful, for example, in semiconductor device applications to be used in power converters. The technology disclosed in the present specification is particularly useful in power semiconductor device applications to be mounted on power converters for vehicles, industrial equipment, and the like.

What is claimed is:

1. A silicon carbide epitaxial wafer comprising:
   a silicon carbide wafer; and
   a silicon carbide epitaxial layer that is disposed on a principal surface of the silicon carbide wafer and contains a first conductivity type impurity,
   wherein
   thickness distribution of the silicon carbide epitaxial layer and concentration distribution of the impurity in the silicon carbide epitaxial layer have a positive correlation in a plane parallel to the principal surface of the silicon carbide wafer.

2. The silicon carbide epitaxial wafer according to claim 1, wherein when a maximum thickness in the thickness distribution of the silicon carbide epitaxial layer is denoted as Tmax, a minimum thickness is denoted as Tmin, and an average thickness is denoted as Tave, width VT (%) of the thickness distribution with respect to average thickness Tave is expressed by the following equation:

$$VT=[\{(Tmax-Tmin)/2\}/Tave]\times100(\%) \quad (3)$$

when a maximum concentration in the concentration distribution in the silicon carbide epitaxial layer is denoted as Cmax, a minimum concentration is denoted as Cmin, and an average concentration is denoted as Cave, width VC (%) of the concentration distribution with respect to average concentration Cave is expressed by the following equation:

$$VC=[\{(Cmax-Cmin)/2\}/Cave]\times100(\%)$$

width VT of the thickness distribution is from 5% to 20%, inclusive, and
width VC of the concentration distribution is from 10% to 40%, inclusive.

3. The silicon carbide epitaxial wafer according to claim 2, wherein width VT of the thickness distribution and width VC of the concentration distribution in the silicon carbide epitaxial layer satisfy:

$$0.5 \leq VC/VT \leq 3.0.$$

4. The silicon carbide epitaxial wafer according to claim 3, wherein width VT of the thickness distribution and width VC of the concentration distribution in the silicon carbide epitaxial layer satisfy:

$$1.0 \leq VC/VT \leq 2.5.$$

5. The silicon carbide epitaxial wafer according to claim 1, wherein when thicknesses of the silicon carbide epitaxial layer at two points a and b in a plane parallel to the principal surface of the silicon carbide wafer are denoted as Da and Db, respectively and concentrations of the impurity in the silicon carbide epitaxial layer at the two points a and b are denoted as Ca and Cb, respectively, Ca>Cb when Da>Db, or Ca<Cb when Da<Db.

6. The silicon carbide epitaxial wafer according to claim 1, wherein a thickness of the silicon carbide epitaxial layer is thinner at a central portion of the principal surface than at a peripheral edge portion of the principal surface and a concentration of the impurity in the silicon carbide epitaxial layer is lower at the central portion than at the peripheral edge portion.

7. The silicon carbide epitaxial wafer according to claim 1, wherein a thickness of the silicon carbide epitaxial layer is thicker at a central portion of the principal surface than at a peripheral edge portion of the principal surface and a concentration of the impurity in the silicon carbide epitaxial layer is higher at the central portion than at the peripheral edge portion.

8. The silicon carbide epitaxial wafer according to claim 1, wherein average concentration Cave in the silicon carbide epitaxial layer is from $3\times10^{15}/cm^3$ to $3\times10^{16}/cm^3$, inclusive and average thickness Tave is from 4 µm to 40 µm, inclusive.

9. The silicon carbide epitaxial wafer according to claim 1, wherein
   the silicon carbide epitaxial wafer has a plurality of device regions, wherein
   each of the plurality of device regions includes a silicon carbide device having
   a second conductivity type body region in contact with the silicon carbide epitaxial layer,
   a first conductivity type source region in contact with the body region, and
   a gate electrode disposed on the silicon carbide epitaxial layer via a gate insulating film.

10. The silicon carbide epitaxial wafer according to claim 1, wherein
    the silicon carbide epitaxial wafer has a plurality of device regions, wherein
    each of the plurality of device regions includes a silicon carbide device having a first electrode that is disposed on the silicon carbide epitaxial layer and is in contact with the silicon carbide epitaxial layer, and a second electrode that is disposed on a surface on a side opposite to the principal surface of the silicon carbide wafer and is in contact with the silicon carbide wafer.

11. The silicon carbide epitaxial wafer according to claim 9, wherein when a maximum value of avalanche breakdown voltage of the silicon carbide device in each of the plurality of device regions is denoted as Bmax, a minimum value is denoted as Bmin, and an average value is denoted as Bave, width VB (%) with respect to average value Bave of the variations in avalanche breakdown voltage of the silicon carbide device between the plurality of device regions is expressed by the following equation:

$$VB(\%)=[\{(Bmax-Bmin)/2\}/Bave]\times 100$$

when a maximum value of a drift resistance of the silicon carbide device in each of the plurality of device regions is denoted as Dmax, a minimum value is denoted as Dmin, and an average value is denoted as Dave, width VD (%) with respect to average value Dave of variations in drift resistance of the silicon carbide device between the plurality of device regions is expressed by the following equation:

$$VD(\%)=[\{(Dmax-Dmin)/2\}/Dave]\times 100$$

and width VB and width VD are from 0% to 10%, inclusive.

12. A silicon carbide device comprising:

a silicon carbide substrate;

a first conductivity type silicon carbide epitaxial layer that is disposed on a principal surface of the silicon carbide substrate and contains a first conductivity type impurity;

a second conductivity type body region in contact with the silicon carbide epitaxial layer;

a first conductivity type source region in contact with the body region; and a gate electrode disposed on the silicon carbide epitaxial layer via a gate insulating film, wherein thickness distribution of the silicon carbide epitaxial layer and concentration distribution of the impurity in the silicon carbide epitaxial layer have a positive correlation in a plane parallel to the principal surface of the silicon carbide substrate.

13. A silicon carbide device comprising:

a silicon carbide substrate;

a first conductivity type silicon carbide epitaxial layer that is disposed on a principal surface of the silicon carbide substrate and contains a first conductivity type impurity;

a first electrode that is disposed on the silicon carbide epitaxial layer and is in contact with the silicon carbide epitaxial layer, and a second electrode that is disposed on a surface on a side opposite to the principal surface of the silicon carbide substrate and is in contact with the silicon carbide substrate, wherein thickness distribution of the silicon carbide epitaxial layer and concentration distribution of the impurity in the silicon carbide epitaxial layer have a positive correlation in a plane parallel to the principal surface of the silicon carbide substrate.

* * * * *